(12) United States Patent
Takeda et al.

(10) Patent No.: US 10,460,989 B2
(45) Date of Patent: Oct. 29, 2019

(54) SEMICONDUCTOR DEVICE AND MANUFACTURING METHOD THEREOF

(71) Applicant: ROHM CO., LTD., Kyoto-shi, Kyoto (JP)

(72) Inventors: Hirofumi Takeda, Kyoto (JP); Satoshi Kimoto, Kyoto (JP)

(73) Assignee: ROHM CO., LTD., Kyoto (JP)

(*) Notice: Subject to any disclaimer, the term of this patent is extended or adjusted under 35 U.S.C. 154(b) by 382 days.

(21) Appl. No.: 15/233,657

(22) Filed: Aug. 10, 2016

(65) Prior Publication Data
US 2017/0054071 A1    Feb. 23, 2017

(30) Foreign Application Priority Data

Aug. 20, 2015  (JP) .................................. 2015-162843

(51) Int. Cl.
*H01L 33/62* (2010.01)
*H01L 21/768* (2006.01)
(Continued)

(52) U.S. Cl.
CPC .... *H01L 21/76873* (2013.01); *G01R 33/0005* (2013.01); *G01R 33/0076* (2013.01);
(Continued)

(58) Field of Classification Search
CPC . H01L 21/76873; H01L 43/065; H01L 43/14; H01L 29/045; H01L 33/60; H01L 33/33–387; H01L 33/62; H01L 27/14603; H01L 31/022433; H01L 41/047; H01L 2021/28; H01L 2224/16225; H01L 2224/97; H01L 2924/15156; H01L 23/13–23/495; G01R 33/0005; G01R 33/0076; G01R 33/0206; F21V 7/00; H01S 5/0425; G02B 6/4243
See application file for complete search history.

(56) References Cited

U.S. PATENT DOCUMENTS

2002/0008325 A1* 1/2002 Tominaga ............... H01L 23/13
                                                  257/778
2006/0001055 A1* 1/2006 Ueno .................... H01L 33/486
                                                  257/257
(Continued)

FOREIGN PATENT DOCUMENTS

JP   2005-277380 A   10/2005
JP   2014-209091 A   11/2014

OTHER PUBLICATIONS

Office Action received in the corresponding Japanese Patent application, Mar. 12, 2019, and corresponding machine translation (7 pages).

*Primary Examiner* — Eric A. Ward
*Assistant Examiner* — Eric K Ashbahian
(74) *Attorney, Agent, or Firm* — Hamre, Schumann, Mueller & Larson, P.C.

(57) ABSTRACT

A semiconductor device includes a semiconductor element, a semiconductor substrate on which the semiconductor element is mounted, a conductive layer formed on the substrate, and a sealing resin covering the semiconductor element. The substrate is formed with a recess receding from a main surface of the substrate and including a bottom surface and first and second sloped surfaces spaced apart from each other in a first direction perpendicular to the thickness direction of the substrate. The conductive layer includes first conduction paths on the first sloped surface, second conduction paths on the second sloped surface and bottom conduction paths on the bottom surface. The second sloped surface includes exposed regions line-symmetrical to the first conduction paths with respect to a line perpendicular to both the thickness direction of the substrate and the first direction, and the second conduction paths are not disposed at the exposed regions.

37 Claims, 18 Drawing Sheets

(51) Int. Cl.
  *H01L 29/04*    (2006.01)
  *G01R 33/00*    (2006.01)
  *G01R 33/02*    (2006.01)

(52) U.S. Cl.
  CPC ........ *G01R 33/0206* (2013.01); *H01L 29/045* (2013.01); *H01L 33/62* (2013.01); *H01L 2224/16225* (2013.01); *H01L 2224/97* (2013.01); *H01L 2924/15156* (2013.01)

(56) References Cited

U.S. PATENT DOCUMENTS

| | | | |
|---|---|---|---|
| 2006/0171081 A1 | 8/2006 | Breuer et al. | |
| 2008/0048203 A1* | 2/2008 | Son .................. | H01L 33/486 257/98 |
| 2012/0024574 A1* | 2/2012 | Inoue .................. | H05K 1/0274 174/250 |
| 2012/0086024 A1* | 4/2012 | Andrews ............ | H01L 25/0753 257/88 |
| 2012/0162984 A1* | 6/2012 | Fujimori ............. | H01L 33/60 362/235 |
| 2012/0181574 A1* | 7/2012 | Nakabayashi ....... | H01L 33/486 257/99 |
| 2012/0313115 A1* | 12/2012 | Joo .................... | H01L 33/486 257/88 |
| 2013/0099375 A1* | 4/2013 | Kim .................. | H01L 24/17 257/737 |
| 2013/0134471 A1* | 5/2013 | Lee ................... | H01L 33/62 257/99 |
| 2014/0103915 A1* | 4/2014 | Satz .................. | G01R 33/0011 324/207.25 |

* cited by examiner

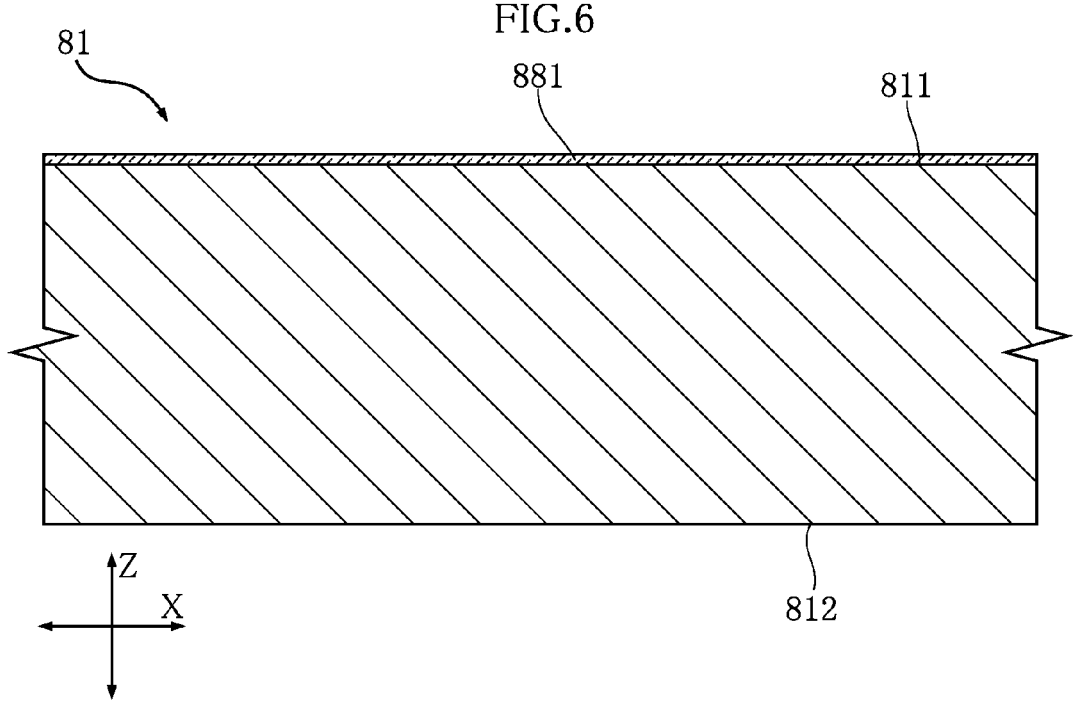
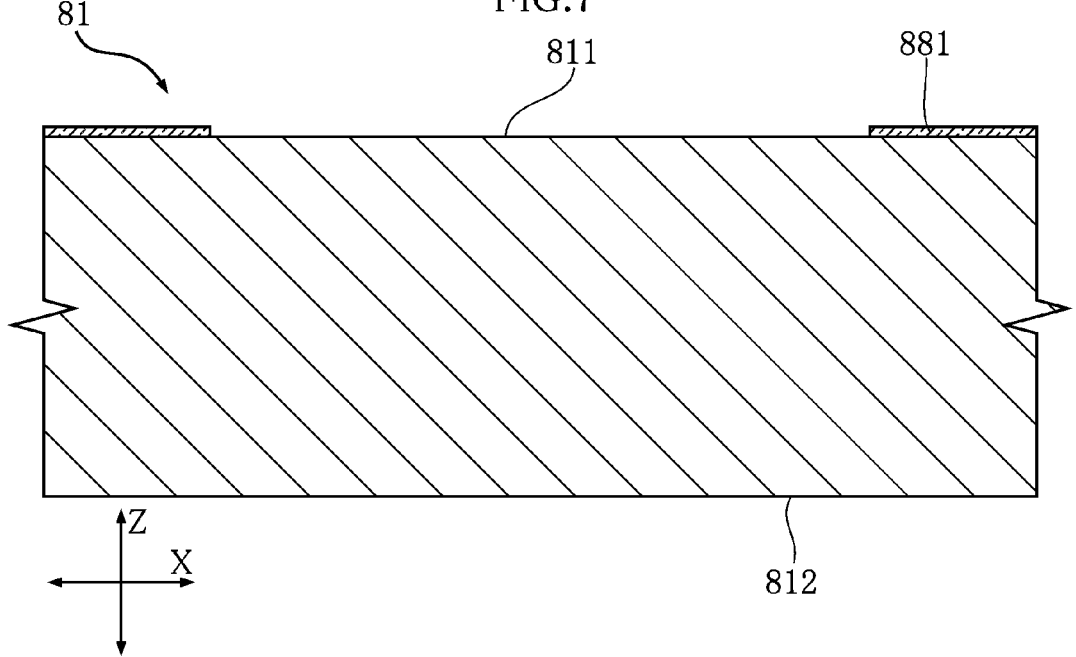

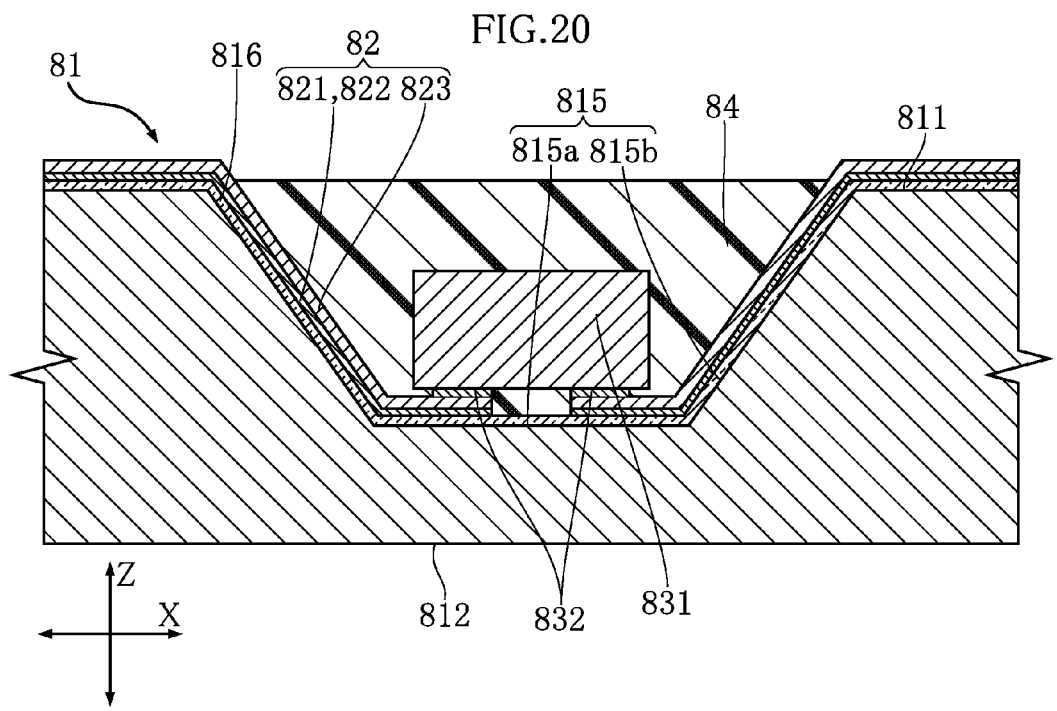
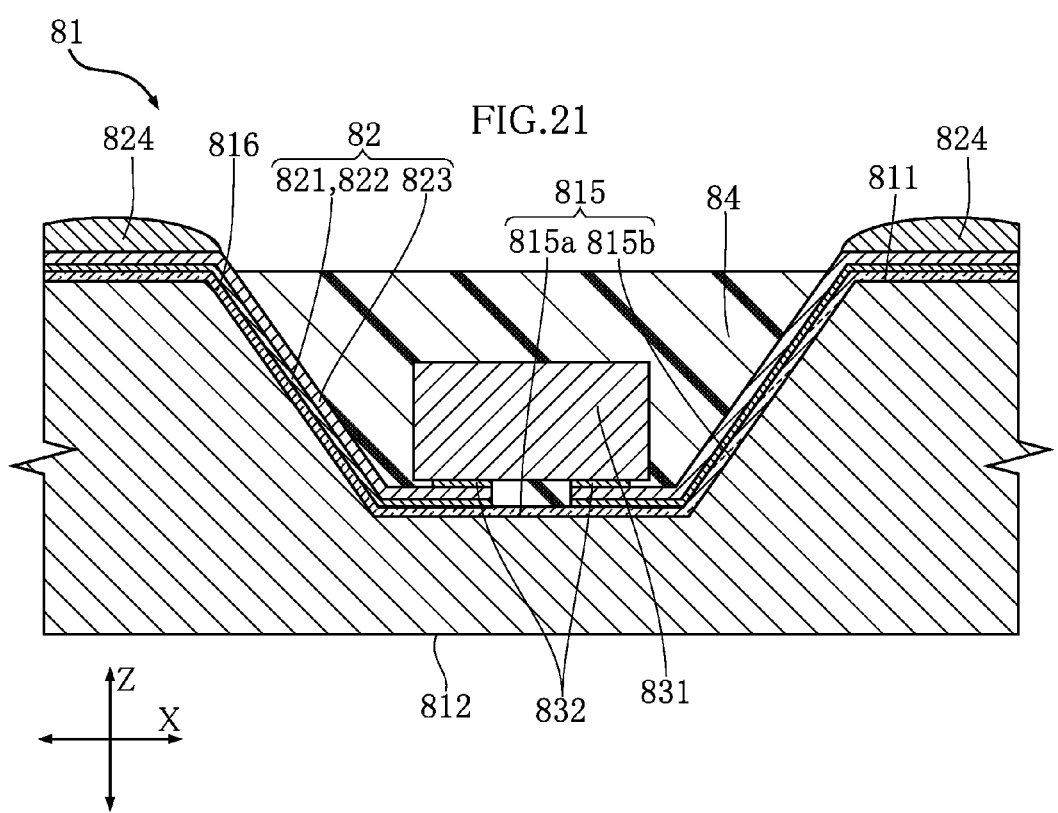

SEMICONDUCTOR DEVICE AND MANUFACTURING METHOD THEREOF

BACKGROUND OF THE INVENTION

1. Field of the Invention

The present invention relates to a semiconductor device with semiconductor elements mounted on a microprocessed semiconductor substrate. The invention also relates to a manufacturing method of such semiconductor devices.

2. Description of the Related Art

Recently, LSI manufacturing technologies are applied to producing micromachines (micro-electro-mechanical systems or MEMS). In producing micromachines, a silicon substrate is subjected to a microprocessing process, and various semiconductor elements are mounted on the processed substrate. To micro-process a silicon substrate, use may be made of anisotropic etching, whereby minute recesses can be formed on the silicon substrate with accuracy.

JP-A-No. 2005-277380 discloses an LED package produced by micromachine manufacturing techniques. This conventional LED package is obtained by forming a recess on a silicon substrate by anisotropic etching and mounting an LED chip on the bottom face of the recess. The recess, formed by anisotropic etching, recedes from a (100) surface of the substrate and has a sloped side face constituted of a (111) surface of the substrate. A conductive layer is formed on the bottom face and the side face for electrical connection of the LED chip to an external circuit board, for example. The conductive layer may be formed by depositing a Cu layer on the bottom face and the side face (e.g. by sputtering), patterning the conductive layer by photolithography, and so on.

To perform the above-mentioned patterning, a resist layer is formed over the deposited Cu layer by application of a suitable resist material, and the obtained resist layer is exposed to light via a photomask. At this stage, when the portion of the resist layer formed on the side face is irradiated, the light may reach the underlying Cu layer through the resist layer and be reflected by the Cu layer. The reflected light may travel toward the bottom face of the recess and irradiate a portion of the resist layer formed over the bottom face. Such exposure of light ("secondary exposure") with respect to the resist layer, however, is not intended and may cause an inconvenience as follows.

Supposing that the recess formed in the substrate has two mutually opposing side faces, light reflected on the respective side faces may irradiate a region of the resist layer on the bottom surface in an overlapping manner. When the resist layer is of a positive type, the region of the resist layer subjected to the overlapped light exposure may be unduly removed in a developing process. Unfavorably, the use of such an improperly patterned resist layer for a subsequent process (such as electrolytic plating for forming an additional conductive layer on the underlying Cu layer, using the resist layer as a mask) will form undesired conductive paths in the final product, which may be a cause of a malfunction such as a short circuit.

SUMMARY OF THE INVENTION

In view of the circumstances described above, it is an object of the present invention to provide a semiconductor device that is capable of addressing the above inconvenience.

According to a first aspect of the invention, there is provided a semiconductor device including: a semiconductor element; a semiconductor substrate on which the semiconductor element is mounted, the substrate having a main surface; a conductive layer formed on the substrate; and a sealing resin covering the semiconductor element. The substrate is formed with a recess receding from the main surface, and the recess includes a bottom surface and first and second sloped surfaces spaced apart from each other in a first direction perpendicular to a thickness direction of the substrate. The conductive layer includes first conduction paths on the first sloped surface, second conduction paths on the second sloped surface and bottom conduction paths on the bottom surface. The second sloped surface includes a plurality of regions that are line-symmetrical to the first conduction paths with respect to an imaginary line parallel to a second direction perpendicular to both the thickness direction of the substrate and the first direction, and the plurality of regions are without the second conduction paths.

According to a second aspect of the invention, there is provided a method of manufacturing a semiconductor device. The method includes: forming at least one groove in a semiconductor substrate having a main surface in a manner such that the groove recedes from the main surface and has a bottom surface and first and second sloped surfaces spaced apart from each other in a first direction perpendicular to a thickness direction of the substrate, and that the groove extends in a second direction perpendicular to both the thickness direction of the substrate and the first direction; forming a conductive layer on the substrate including the groove; mounting semiconductor elements on the bottom surface and with intervals between the semiconductor elements, the semiconductor elements being accommodated in the groove; forming a sealing resin for covering the semiconductor elements; and cutting the substrate along the first direction and the second direction thereby dividing the substrate into individual pieces each including one of the semiconductor elements. The forming of the conductive layer includes patterning by photolithography for forming the conductive layer on the substrate with the groove in a manner such that the photolithography forms first exposure regions at the first sloped surface and second exposure regions at the second sloped surface, and that none of the second exposure regions is line-symmetrical to any one of the first exposure regions with respect to an imaginary line parallel to the second direction.

Other features and advantages of the present invention will become more apparent from the detailed description given below with reference to the accompanying drawings.

BRIEF DESCRIPTION OF DRAWINGS

FIG. 6 is a cross-sectional view showing a process in a manufacturing method of the semiconductor device of FIG. 1;

FIG. 7 is a cross-sectional view showing a process in the manufacturing method of the semiconductor device;

FIG. 20 is a cross-sectional view showing a process in the manufacturing method of the semiconductor device;

FIG. 21 is a cross-sectional view showing a process in the manufacturing method of the semiconductor device;

DETAILED DESCRIPTION OF THE PREFERRED EMBODIMENTS

Figure 1:
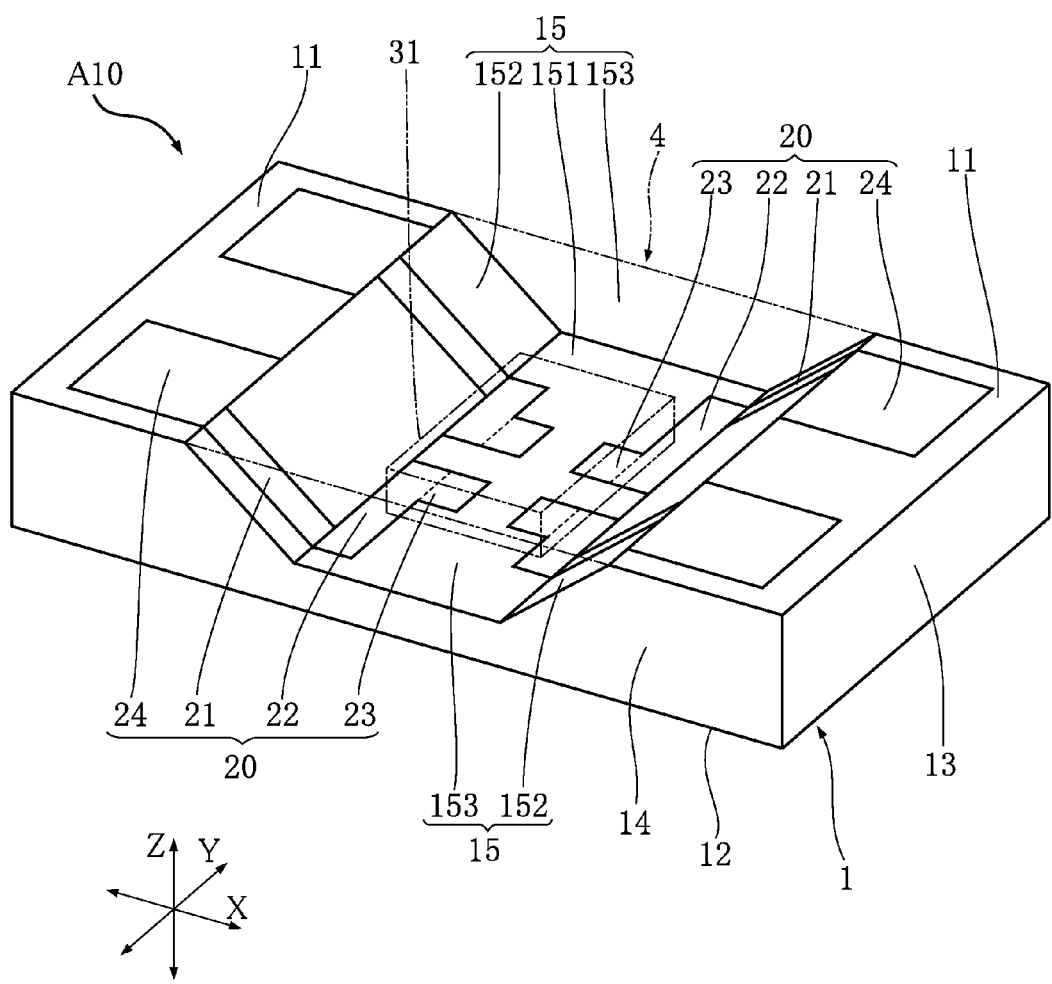
FIG. 1 is a perspective view illustrating a semiconductor device according to a first embodiment.

Embodiments of the present invention will be described below with reference to the accompanying drawings.

First Embodiment

Referring to FIG. 1 to FIG. 5, a semiconductor device A10 according to a first embodiment will be described. For the purpose of the description, a left-right direction in plan view will be referred to as first direction X, and an up-down direction in plan view, perpendicular to the first direction X, will be referred to as second direction Y. The first direction X and the second direction Y are both perpendicular to a thickness direction Z of the semiconductor device A10 (or substrate 1).

The semiconductor device A10 includes a substrate 1, an insulation layer 16, a conductive layer 20, a semiconductor element 31, a bonding layer 32, and a sealing resin 4. The semiconductor device A10 is mounted on an external circuit board, for example. In this embodiment, the semiconductor device A10 has a rectangular shape in plan view.

Figure 2:
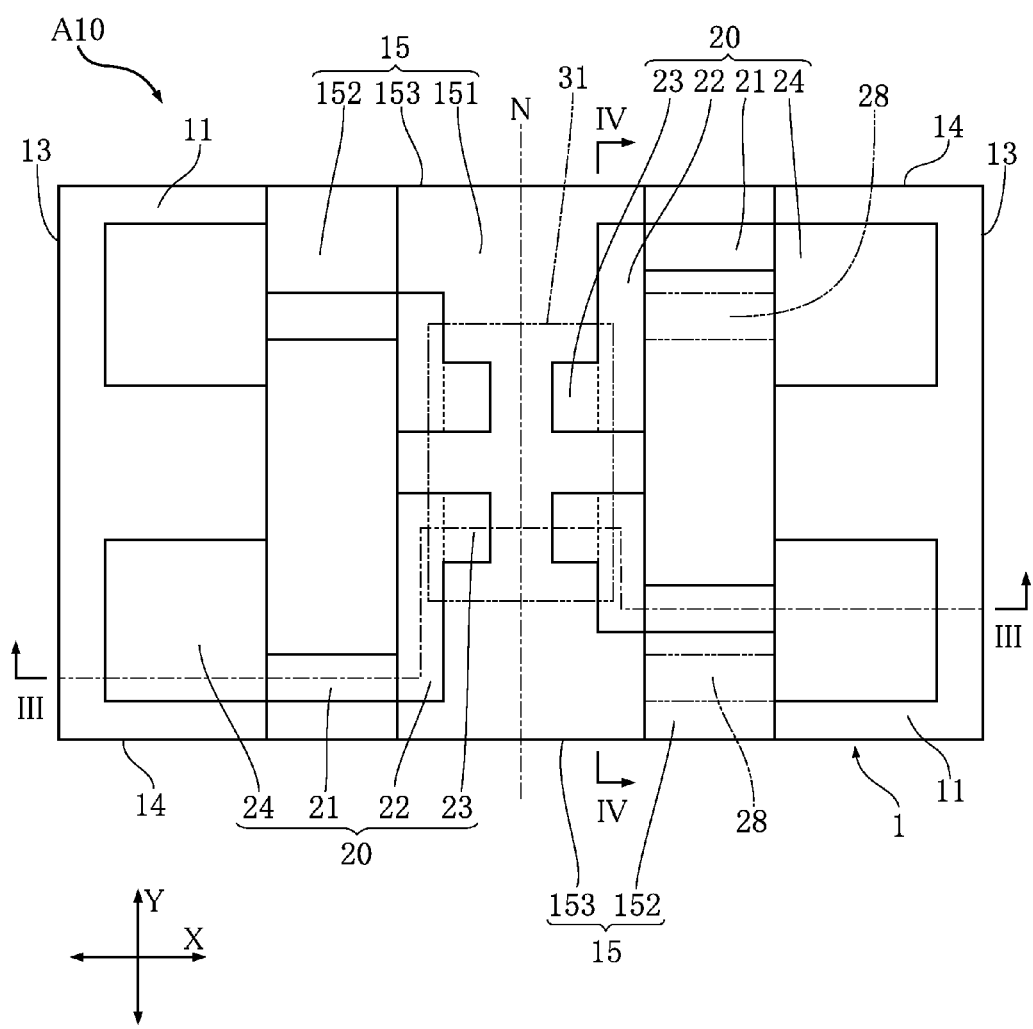
FIG. 2 is a plan view showing the semiconductor device of FIG. 1.
Figure 3:
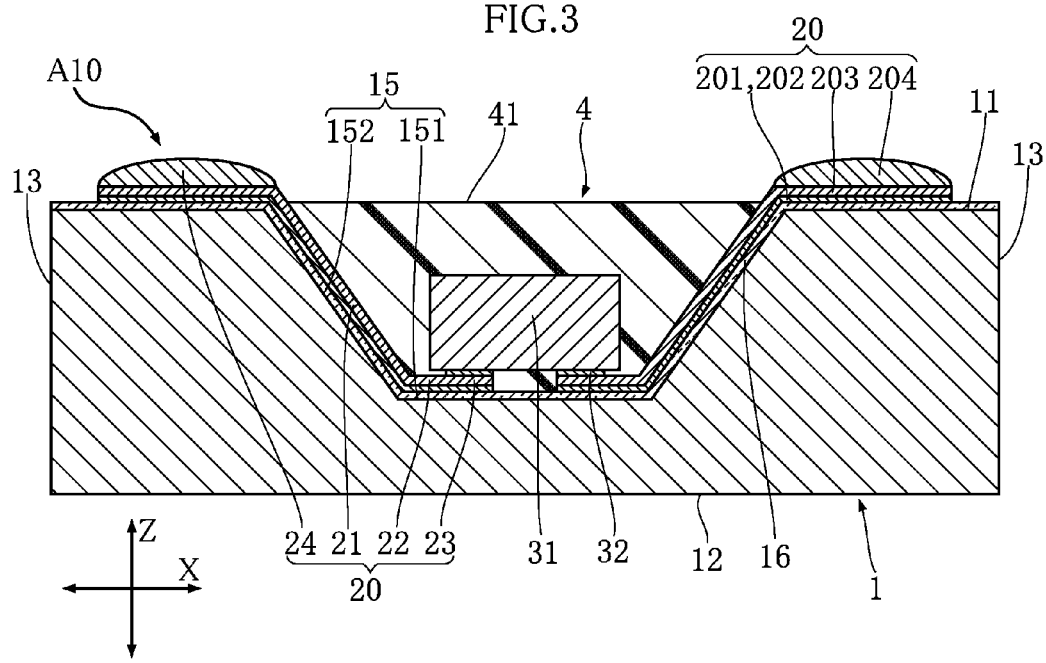
FIG. 3 is a cross-sectional view taken along a line III-III in FIG. 2.
Figure 4:
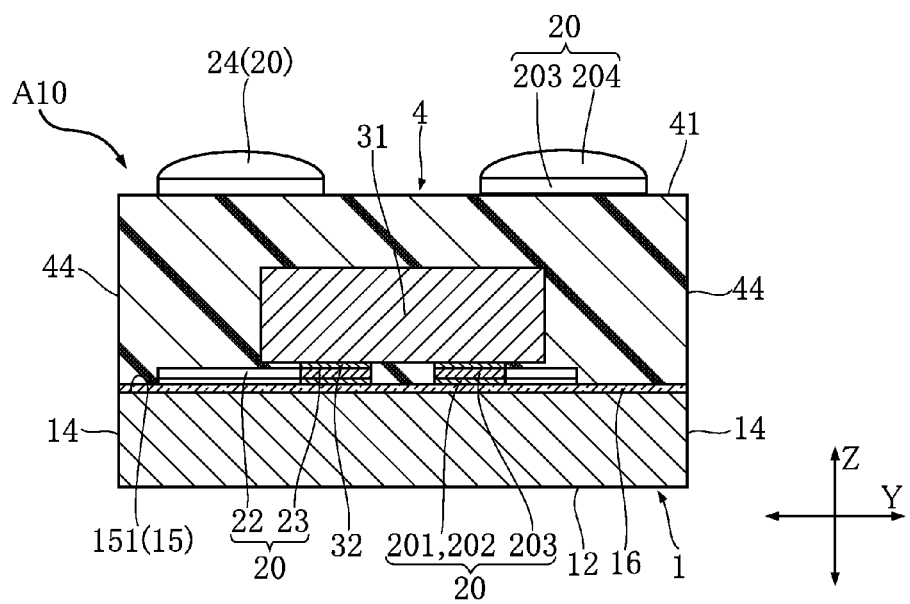
FIG. 4 is a cross-sectional view taken along a line IV-IV in FIG. 2.
Figure 5:
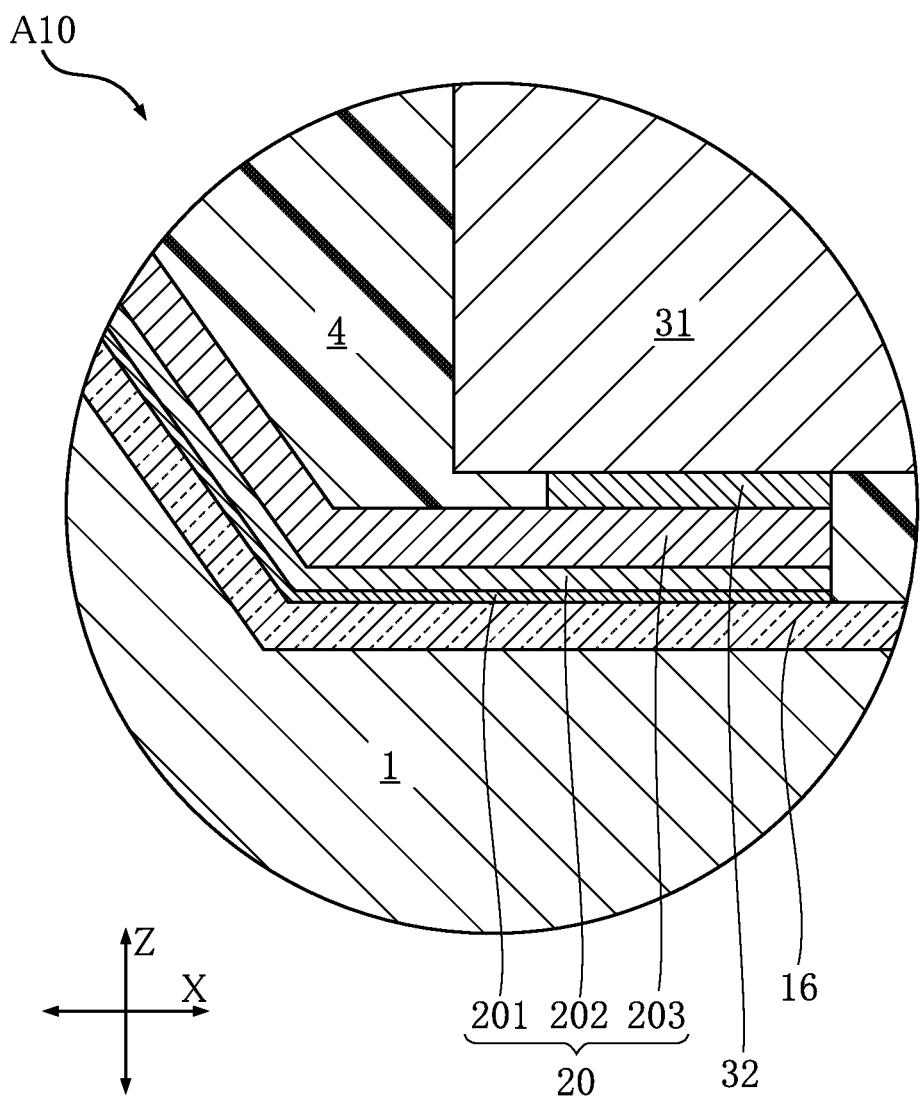
FIG. 5 is an enlarged view of a portion depicted in FIG. 3.

FIG. 1 is a perspective view showing the semiconductor device A10. FIG. 2 is a plan view showing the semiconductor device A10. FIG. 3 is a cross-sectional view taken along a line III-III (chain line) in FIG. 2. FIG. 4 is a cross-sectional view taken along a line IV-IV in FIG. 2. FIG. 5 is an enlarged fragmentary cross-sectional view of a portion in FIG. 3. For clarity, in FIG. 1, the sealing resin 4 and the semiconductor element 31 are indicated by imaginary lines (double-dot chain lines).

The substrate 1, with the semiconductor element 31 mounted thereon, serves as base of the semiconductor device A10. The substrate 1 is made of a monocrystalline semiconductor material such as Si. In this embodiment the substrate 1 has a thickness of 300 to 750 µm. As shown in FIG. 2, the substrate 1 has a rectangular shape in plan view, the sides in the first direction X being the longer sides. The substrate 1 includes a main surface 11, a back surface 12, a pair of first side faces 13, a pair of second side faces 14, and a recess 15.

The main surface 11 corresponds to the upper surface of the substrate 1 shown in FIG. 1. A plurality of terminals 24 of the conductive layer 20 are formed on the main surface 11, and hence the semiconductor device A10 is surface-mounted on e.g. an external circuit board via the main surface 11. The back surface 12 corresponds to the lower surface of the substrate 1 shown in FIG. 1. When the semiconductor device A10 is surface-mounted on the circuit board, the back surface faces upward. As is apparent from FIG. 1, the main surface 11 and the back surface 12 are both orthogonal to the thickness direction Z of the substrate 1. The main surface 11 and the back surface 12 face in opposite directions in the thickness direction Z of the substrate 1. The main surface 11 and the back surface 12 are both flat. In this embodiment, the main surface 11 is a (100) surface. The recess 15 formed in the substrate 1 recedes from the main surface 11. Because of the presence of the recess 15, the main surface 11 is divided into two rectangular portions in plan view, spaced apart from each other in the first direction X.

As shown in FIG. 1 and FIG. 2, the pair of first side faces 13 are spaced apart from each other in the first direction X. The pair of second side faces 14 are spaced apart from each other in the second direction Y. The first side faces 13 and the second side faces 14 are all orthogonal to the main surface 11 and the back surface 12. In addition, the first side faces 13 and the second side faces 14 face outwardly of the semiconductor device A10.

As shown in FIG. 1 and FIG. 2, the recess 15 is formed so as to recede from the main surface 11. The recess 15 is not formed all the way through the substrate 1 in the thickness direction Z. In this embodiment, the recess 15 includes a bottom surface 151, two sloped surfaces 152, and two openings 153. In this embodiment, the bottom surface 151 has a rectangular shape in plan view. The bottom surface 151 includes a region where the semiconductor element 31 is to be mounted. The bottom surface 151 is flat and orthogonal to the thickness direction Z of the substrate 1.

As shown in FIG. 1 and FIG. 2, the pair of sloped surfaces 152 are spaced apart from each other in the first direction X. The lower ends of the sloped surfaces 152 are respectively connected to the ends of the bottom surface 151 in the first direction X. The upper ends of the sloped surfaces 152 are each connected to the main surface 11. As described below, the recess 15 is formed by anisotropic etching. In this embodiment the main surface 11 is the (100) surface, and the sloped surfaces 152 are (111) surfaces. The inclination angles of the respective sloped surfaces 152 with respect to the bottom surface 151 are both 54.74°.

As shown in FIG. 1, the respective opening 153 cause the recess 15 to be laterally open to the outside at the second side faces 14. The opening 153 has a trapezoidal shape having the upper base longer than the lower base (between the ends of the bottom surface 151 spaced in the second direction Y), defined by the intersections between the bottom surface 151 and the pair of sloped surfaces 152. In this embodiment, the sealing resin 4 is exposed from the openings 153.

With the above configuration, the cross-sectional shape of the recess 15 is uniform in the second direction Y and identical to the shape of the openings 153.

The insulation layer 16 is an electrically insulative film formed over, as shown in FIG. 3 to FIG. 5, the main surface 11, the bottom surface 151, and the pair of sloped surfaces 152. In this embodiment, the insulation layer 16 is made of $SiO_2$, and has a thickness of 1 to 2 µm. Since the substrate 1 is made of a semiconductor material and the conductive layer 20 formed on the substrate 1 as shown in FIG. 1 and FIG. 2, electrical insulation has to be provided in the region on the substrate 1 where the conductive layer 20 is formed.

The conductive layer 20 constitutes a conduction path between the semiconductor device A10 and an external circuit board, for example. As shown in FIG. 1 and FIG. 2, the conductive layer 20 is formed along the main surface 11, the bottom surface 151, and the sloped surfaces 152. The conductive layer 20 is formed in contact with the insulation layer 16, and includes a barrier layer 201, a seed layer 202, and a plated layer 203. As shown in FIG. 5, the barrier layer 201 is formed in contact with the insulation layer 16. In this embodiment, the barrier layer 201 is made of Ti. The seed layer 202 is formed in contact with the barrier layer 201. The plated layer 203 is formed in contact with the seed layer 202. In this embodiment, the seed layer 202 and the plated layer 203 are made of Cu. The barrier layer 201, the seed layer 202, and the plated layer 203 are stacked on each other, such that the seed layer 202 is interposed between the barrier layer 201 and the plated layer 203. Since the seed layer 202 and the plated layer 203 are made of Cu, the barrier layer 201 serves to suppress diffusion of Cu toward the insulation layer 16. The barrier layer 201 has a thickness of 10 to 30 nm. The seed layer 202 is formed to facilitate the plated layer 203 to be smoothly formed. The seed layer 202 has a thickness of 50 to 300 nm. The plated layer 203 has a thickness of 2 to 10 µm, which is thicker than the seed layer 202.

The conductive layer 20 is made up of various parts, such as intermediate conduction paths 21, bottom conduction paths 22, pads 23, and terminals 24.

As shown in FIG. 1 and FIG. 2, the intermediate conduction paths 21 are strip-shaped portions in plan view, formed on the sloped surfaces 152. In this embodiment, the intermediate conduction paths 21 are formed as strip-shaped portions extending parallel to the first direction X in plan view. The bottom conduction paths 22 are strip-shaped portions in plan view, formed on the bottom surface 151. In this embodiment, the bottom conduction paths 22 are formed so as to extend parallel to the second direction Y and in contact with the intersection between the bottom surface 151 and the sloped surfaces 152. In the illustrated embodiment, two right-side intermediate conduction paths 21 (formed on one or first sloped surface 152) are electrically connected to the corresponding two right-side bottom conduction paths 22, respectively. Similarly, the two left-side intermediate conduction paths 21 (formed on the other or second sloped surface 152) are electrically connected to the corresponding two left-side bottom conduction paths 22, respectively.

Referring to FIG. 2, there are two exposed regions 28 in the first sloped surface 152 (right in FIG. 2), which are line-symmetrical with respect to an imaginary line N parallel to the second direction Y to two regions in the second sloped surface 152 (left in FIG. 2) where the two left-side intermediate conduction paths 21 are formed. In this specification, the exposed regions 28 in the first sloped surface 152 will be referred to as "line-symmetrical regions" 28. Note that the line-symmetrical regions 28 in the first sloped surface 152 are not covered with the intermediate conduction paths 21.

As shown in FIG. 1 to FIG. 4, the pads 23 are rectangular in plan view, formed on the bottom surface 151. The semiconductor element 31 is mounted on the pads 23. In this embodiment, the pads 23 protrude from the bottom conduction paths 22 in the first direction X toward the center of the substrate 1, and each pad 23 is electrically connected to a corresponding one of the bottom conduction paths 22. As shown in FIG. 2, the pads 23 are each located at a position deviated from the intermediate conduction paths 21 in the second direction Y, so as not to overlap with any of the intermediate conduction paths 21 as viewed in the first direction X.

As shown in FIG. 1 and FIG. 2, the terminals 24 are rectangular in plan view, formed on the main surface 11. The terminals 24 are used to surface-mount the semiconductor device A10 on an external circuit board. In this embodiment, two terminals 24, mutually spaced, are formed on each of two regions of the main surface 11 spaced apart from each other in the first direction X. Each terminal 24 has one side or edge that is disposed in contact with the upper end of the corresponding sloped surface 152, and that is electrically connected to the corresponding intermediate conduction path 21. As shown in FIG. 3, each terminal 24 is provided with a bump layer 204 formed on the plated layer 203. The bump layer 204 is formed so as to bulge in the same direction in which the main surface 11 faces, in the thickness direction Z of the substrate 1. In this embodiment, the bump layer 204 is, for example, composed of Ni, Pd, and Au stacked on each other.

The semiconductor element 31 is, as shown in FIG. 3 to FIG. 5, mounted on the pad 23 formed on the bottom surface 151, via the bonding layer 32. In this embodiment, the semiconductor element 31 is a Hall-effect element, and the semiconductor device A10 serves as a magnetic sensor. In this embodiment, in addition, the semiconductor element 31 is of a GaAs type. The GaAs Hall-effect element is excellent in linearity of the hall voltage with respect to fluctuation of magnetic flux, and insusceptible to temperature fluctuation.

The bonding layer 32 serves, as shown in FIG. 3 to FIG. 5, to bond the semiconductor element 31 to the pads 23, so as to secure electrical conduction therebetween. The bonding layer 32 is formed as a solder bump formed so as to cover non-illustrated element terminals located on the lower surface of the semiconductor element 31 shown in FIG. 5, and the semiconductor element 31 is mounted on the pads 23 by flip-chip bonding (FCB).

The sealing resin 4 is, for example, made of an electrically insulative black epoxy resin. The sealing resin 4 is, as shown in FIG. 1 to FIG. 4, filled in the recess 15 so as to cover bottom surface 151, the pair of sloped surfaces 152, the intermediate conduction paths 21, the bottom conduction paths 22, the pads 23, and the semiconductor element 31. Here, the main surface 11 and the terminals 24 are not covered with the sealing resin 4 but exposed therefrom. In this embodiment, the sealing resin 4 includes a resin main surface 41 and a pair of resin side faces 44. The resin main surface 41 and the resin side faces 44 are all exposed surfaces of the semiconductor device A10.

As shown in FIG. 1 and FIG. 3, the resin main surface 41 is a flat surface that faces in the same direction as the main surface 11. As shown in FIG. 1, the pair of resin side faces 44 are spaced apart from each other in the second direction Y. The resin side faces 44 face in opposite directions in the second direction Y, and flush with the respective second side faces 14.

Figure 22:
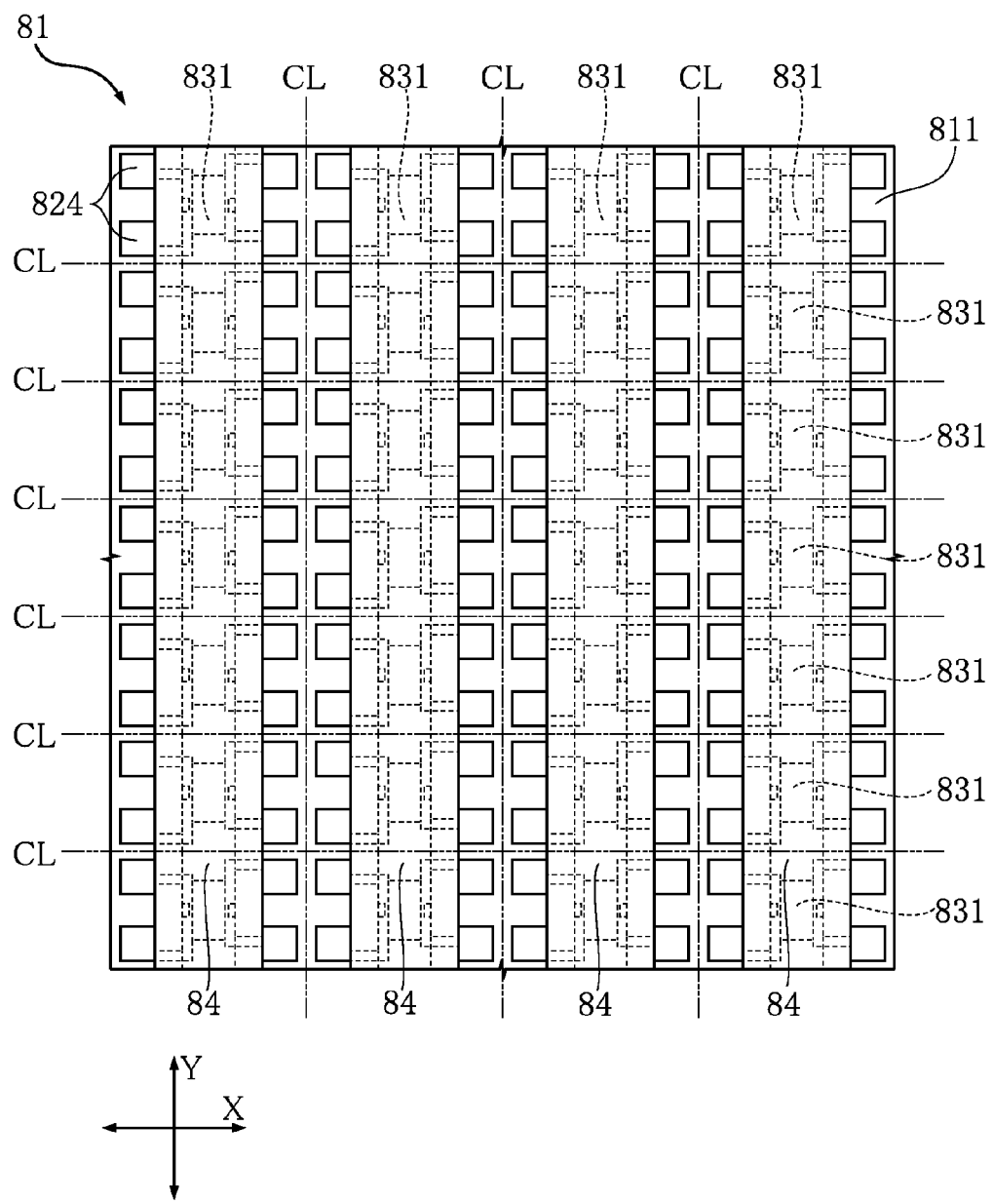
FIG. 22 is a plan view showing a process in the manufacturing method of the semiconductor device.

Referring now to FIG. 6 to FIG. 22, a manufacturing method of the semiconductor device A10 will be described hereunder. FIG. 6 to FIG. 9, FIG. 11 to FIG. 14, and FIG. 16 to FIG. 21 are cross-sectional views for explaining processes in the manufacturing method of the semiconductor device A10. The cross-sectional views correspond to the cross-sectional view shown in FIG. 3. FIG. 10 is a perspective view showing a substrate 81 obtained after the process shown in FIG. 9. FIG. 15 is a plan view showing the substrate 81 subjected to exposure in the process of FIG. 14. FIG. 22 is a plan view showing a process in the manufacturing method of the semiconductor device A10.

Referring first to FIG. 6, a substrate 81 is prepared. The substrate 81 is an aggregation of the substrates 1 of the semiconductor device A10. The substrate 81 is made of a monocrystalline semiconductor material, which is monocrystalline Si in this embodiment. The substrate 81 has a thickness of 300 to 750 μm. The substrate 81 includes a main surface 811 and a back surface 812. The main surface 811 faces upward in FIG. 6, while the back surface 812 faces downward. The main surface 811 and the back surface 812 face in opposite directions in the thickness direction Z of the substrate 81. The main surface 811 and the back surface 812 are both flat. In this embodiment, the main surface 811 constitutes a (100) surface. A mask layer 881, for example made of $Si_3N_4$, is formed on the main surface 811. The mask layer 881 may be formed through a plasma CVD process.

Referring to FIG. 7, patterning is performed over the mask layer 881 by photolithography, and then the mask layer 881 is partially removed by reactive ion etching (RIE), a typical example of dry etching methods. When the mask layer 881 is made of $Si_3N_4$ as mentioned above, $CF_4$ is employed as etching gas. Through the etching, a plurality of openings, each extending in the second direction Y and having a certain width in the first direction X, are formed on the mask layer 881. Here, FIG. 7 depicts the cross-section of one of such openings.

Figure 8:
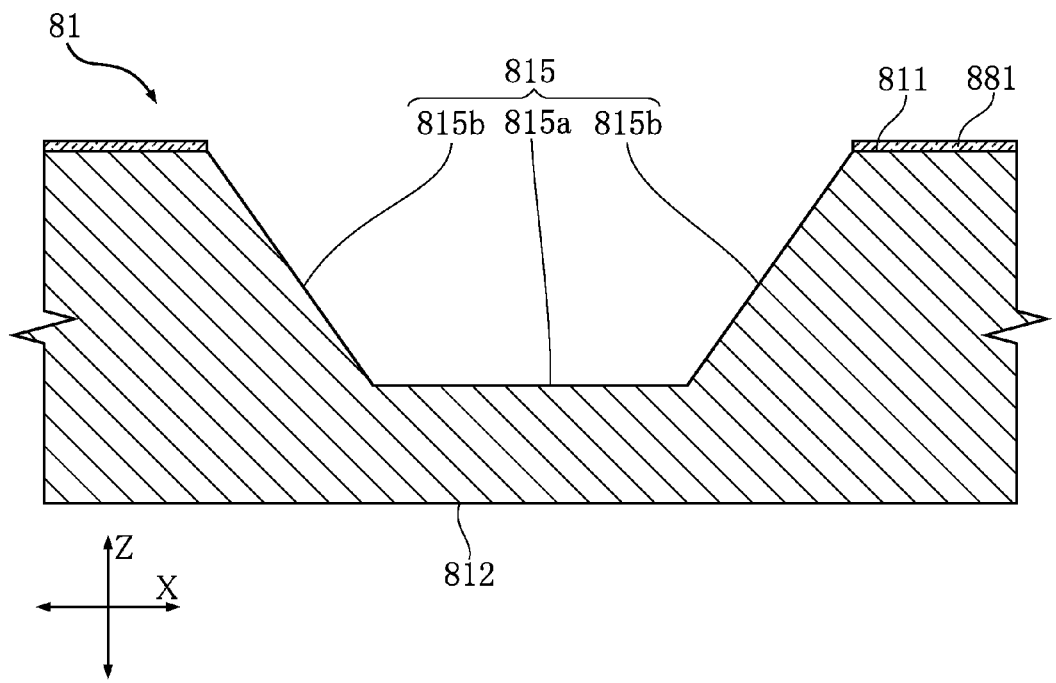
FIG. 8 is a cross-sectional view showing a process in the manufacturing method of the semiconductor device.

Referring to FIG. 8, a plurality of grooves 815 are then formed on the substrate 81 so as to recede from the main surface 811 (only one groove 815 is shown in the figure). The grooves 815 each extend in the second direction Y. In this embodiment, the grooves 815 each include a bottom surface 815a and a pair of sloped surfaces 815b. The pair of sloped surfaces 815b are spaced apart from each other in the first direction X, and have the lower ends connected to the respective ends of the bottom surface 815a in the first direction X. The upper ends of the sloped surfaces 815b are each connected to the main surface 811. The grooves 815 may be formed by anisotropic etching using an alkaline solution. The alkaline solution may be, for example, a potassium hydroxide (KOH) solution or a tetramethyl ammonium hydroxide (TMAH) solution. In this embodiment, since the main surface 811 constitutes the (100) surface, the surfaces of the intermediate surface 814b each constitute a (111) surface. Through the above process, the grooves 815 are formed in the respective openings formed in the mask layer 881.

Figure 9:
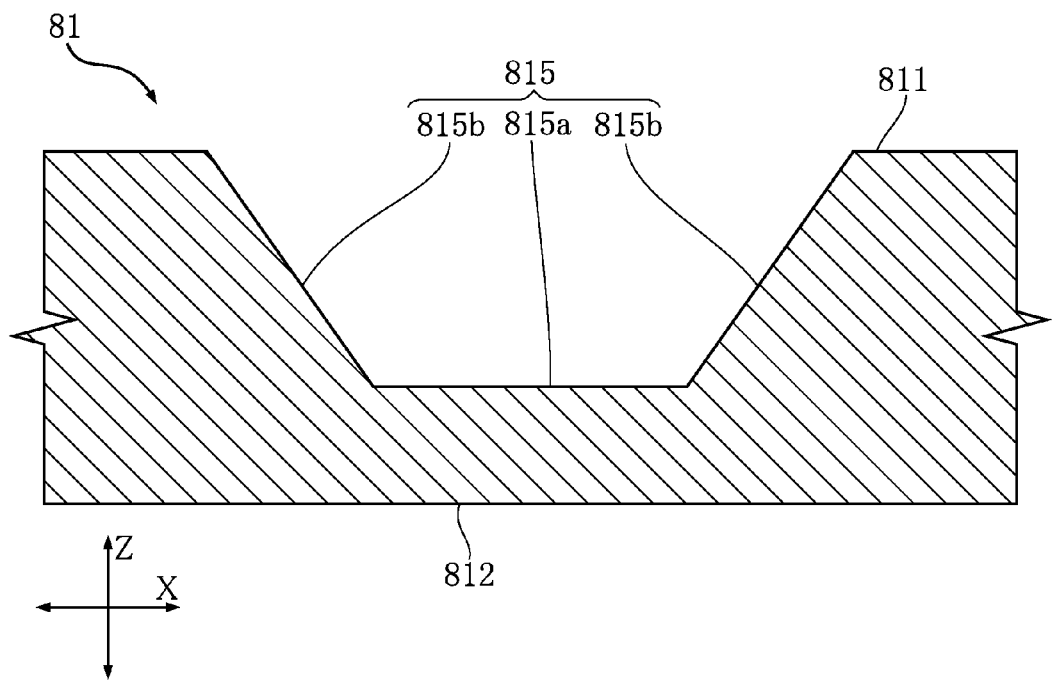
FIG. 9 is a cross-sectional view showing a process in the manufacturing method of the semiconductor device.
Figure 10:
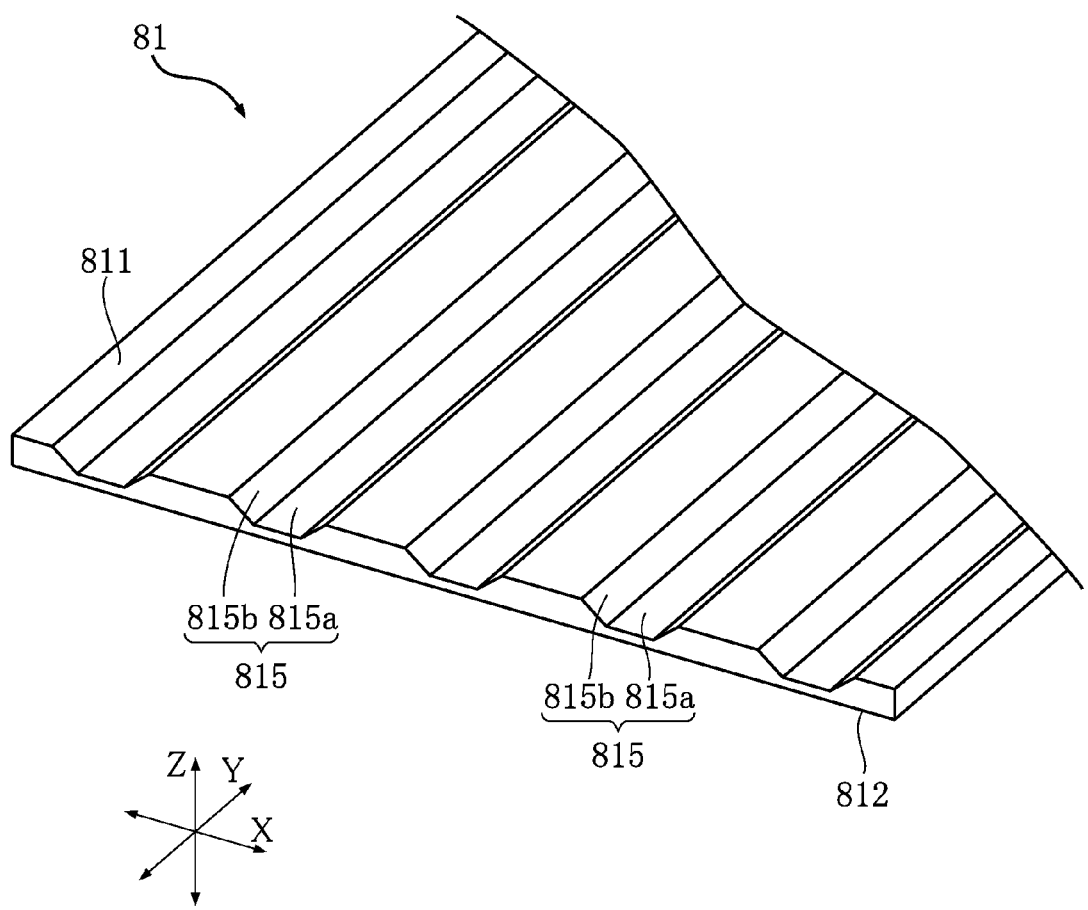
FIG. 10 is a perspective view showing a substrate obtained after the process shown in FIG. 9.

Referring to FIG. 9, the mask layer 881 remaining on the main surface 811 is thoroughly removed, by reactive ion etching utilizing $CF_4$ as etching gas, or wet etching utilizing heated solution of phosphoric acid, when the mask layer 881 is made of $Si_3N_4$ as in this embodiment. FIG. 10 is a perspective view of the substrate 81 from which the mask layer 881 has been thoroughly removed. As shown in FIG. 10, a plurality of grooves 815 spaced apart from each other in the first direction X and extending in the second direction Y are formed so as to recede from the main surface 811 of the substrate 81.

Figure 11:
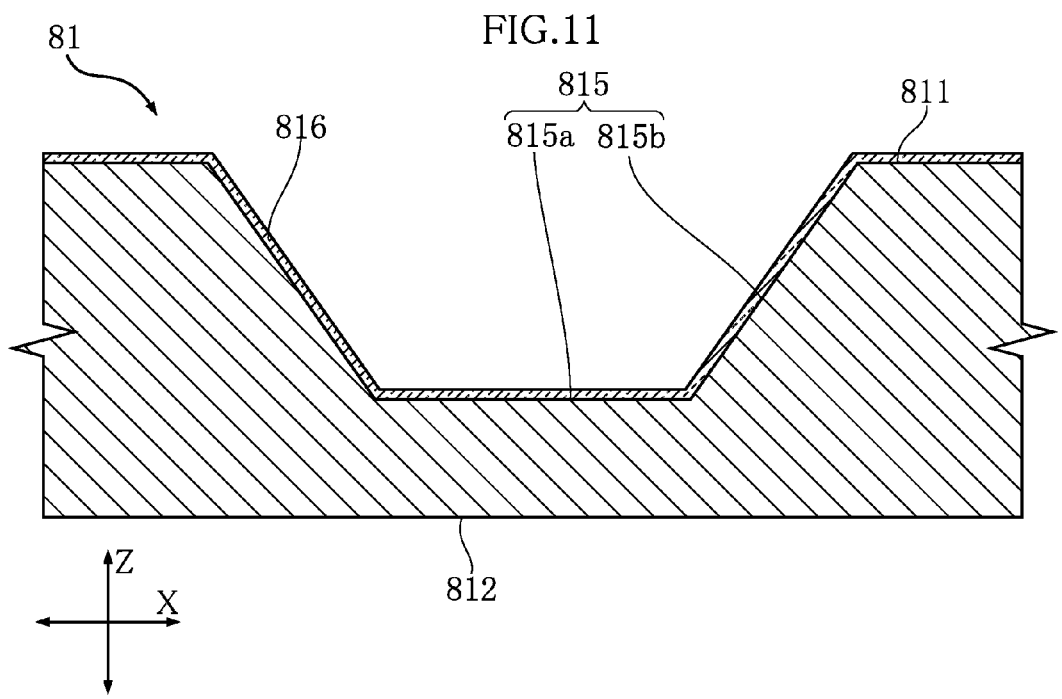
FIG. 11 is a cross-sectional view showing a process in the manufacturing method of the semiconductor device shown in FIG. 1.

Proceeding to FIG. 11, an insulation layer 816 is formed on the substrate 81 including the grooves 815. The insulation layer 816 corresponds to the insulation layer 16 of the semiconductor device A10. In this embodiment the insulation layer 816 is made of $SiO_2$, in a thickness of 1 to 2 μm. The insulation layer 816 may be formed by thermal oxidation of not only the main surface 811 but also the bottom surface 815a and the pair of sloped surfaces 815b constituting the groove 815.

Then a conductive layer 82 is formed on the substrate 81 including the grooves 815. The conductive layer 82 corresponds to the conductive layer 20 of the semiconductor device A10. The process of forming the conductive layer 82 includes forming a barrier layer 821 in contact with the insulation layer 816, forming a seed layer 822, forming a pattern of the conductive layer 82 by photolithography, forming a plated layer 823 on a region where the seed layer 822 is exposed, and removing the seed layer 822 not covered with the plated layer 823.

Figure 12:
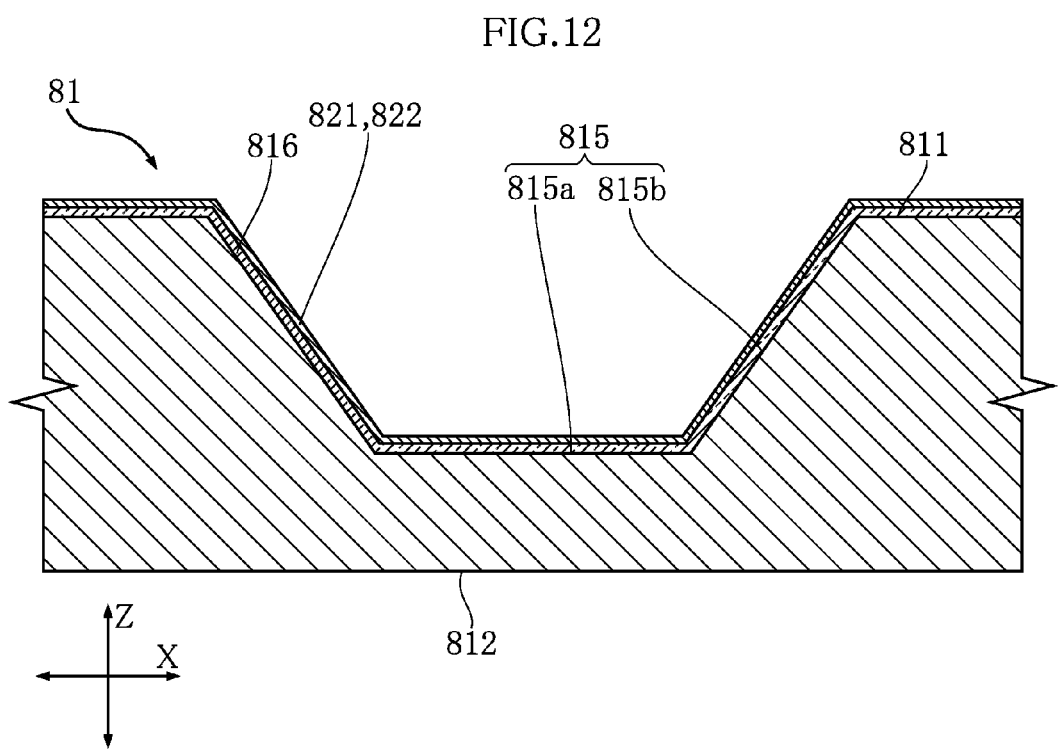
FIG. 12 is a cross-sectional view showing a process in the manufacturing method of the semiconductor device.

First, as shown in FIG. 12, the barrier layer 821 and the seed layer 822 are formed on the substrate 81 including the grooves 815. The barrier layer 821 and the seed layer 822 are formed over the same region where the insulation layer 816 has been formed. The barrier layer 821 contacting the insulation layer 815 is formed first, and then the seed layer 822 is formed in contact with the barrier layer 821. The barrier layer 821 and the seed layer 822 are both formed by sputtering. In this embodiment, the barrier layer 821 is made of Ti in a thickness of 10 to 30 nm. The seed layer 822 is made of Cu, in a thickness of 50 to 300 nm.

Figure 13:
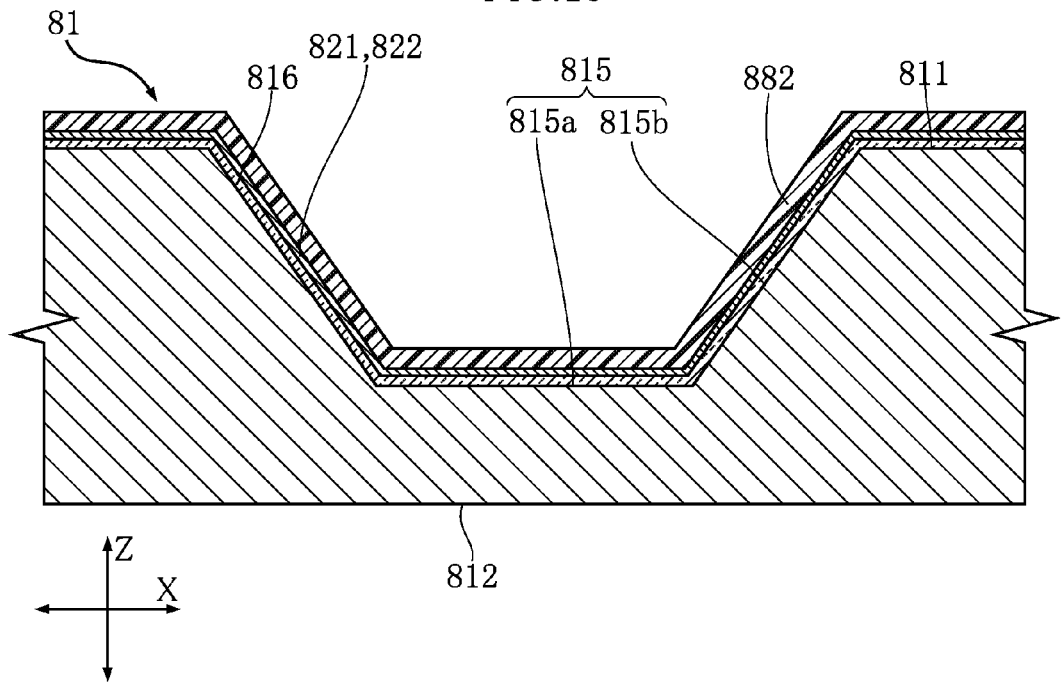
FIG. 13 is a cross-sectional view showing a process in the manufacturing method of the semiconductor device.

Then the pattern for forming the conductive layer 82 is formed by photolithography, on the substrate 81 including the grooves 815. Referring to FIG. 13, a resist layer 882 is formed on the substrate 81 including the grooves 815. The resist layer 882 is formed over the same region where the insulation layer 816 has been formed. The resist layer 882 may be formed, for example, by spraying a resist over the seed layer 822. In this embodiment, the resist is a positive resist.

Figure 14:
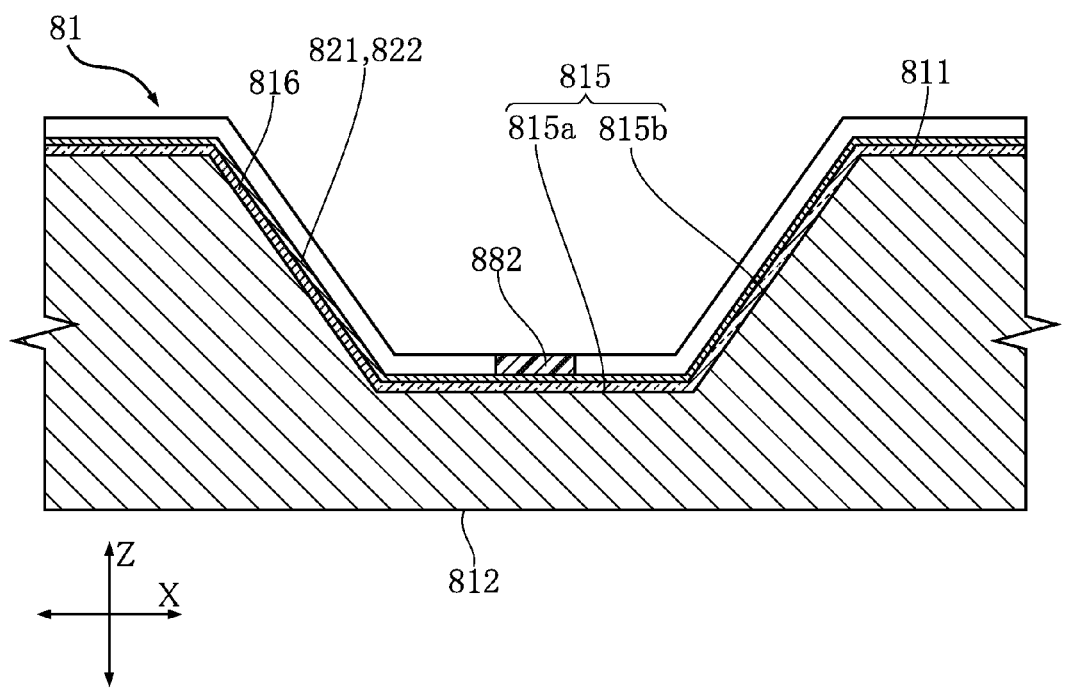
FIG. 14 is a cross-sectional view showing a process in the manufacturing method of the semiconductor device.
Figure 15:
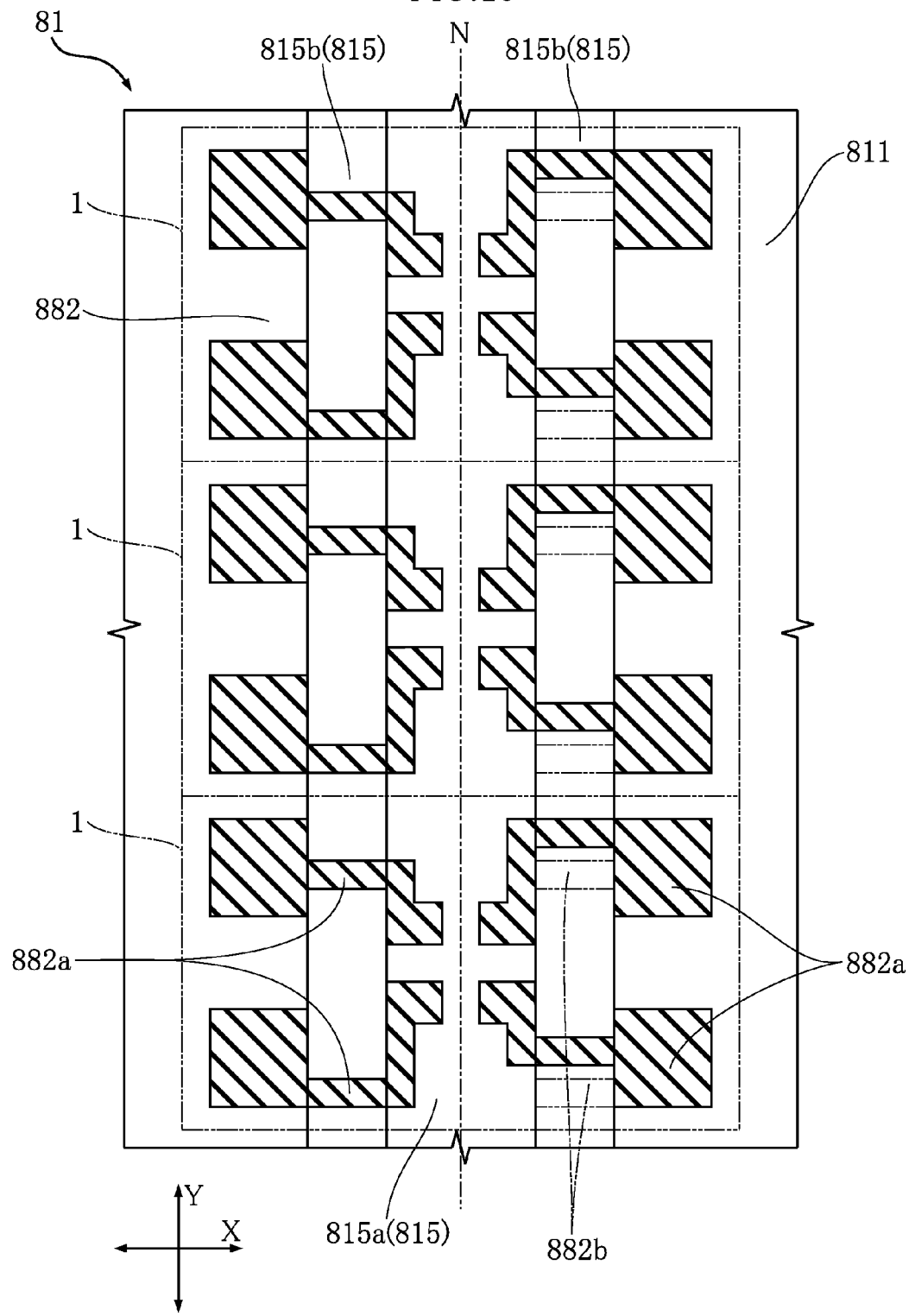
FIG. 15 is a plan view showing the substrate subjected to exposure in the process of FIG. 14.

Proceeding to FIG. 14, the resist layer 882 is exposed and developed. Since the resist layer 882 is made of a positive resist, the exposed portion of the resist layer 882 is removed by a solution used for the development. Through the above process, the patterning on the substrate 81 including the grooves 815 is completed.

FIG. 15 is a plan view showing the substrate 81 subjected to the exposure. In FIG. 15, hatched portions represent exposure regions 882a formed on the substrate 81 by photolithography. The exposure regions 882a represent the exposed regions of the resist layer 882. In addition, sections in FIG. 15 surrounded by imaginary lines (double-dot chain lines) each correspond to the substrate 1 of the semiconductor device A10.

As shown in FIG. 15, the exposure regions 882a are formed parallel to the first direction X, on each the sloped surfaces 815b. On the bottom surface 815a, in addition, the exposure regions 882a each including a portion extending parallel to the second direction Y, the portion being located in contact with the intersection between the bottom surface 815a and the sloped surface 815b, are formed. The exposure regions 882a formed on the bottom surface 815a are each connected to the corresponding exposure region 882a formed on the sloped surfaces 815b. Upon developing the exposure regions 882a formed as above, the seed layer 822 is exposed from the exposure regions 882a.

Referring to FIG. 15, regions in one of the sloped surfaces 815b (on the right in FIG. 15), that are respectively line-symmetrical to the exposure regions 882a formed by photolithography in the other sloped surface 815b (on the left in FIG. 15), with respect to the line N parallel to the second direction Y, will be defined as line-symmetrical regions 882b. The line-symmetrical regions 882b are indicated by imaginary lines (double-dot chain lines) in FIG. 15. In this embodiment, the line-symmetrical regions 882b in the first mentioned sloped surface 815b are without the exposure regions 882a.

Figure 16:
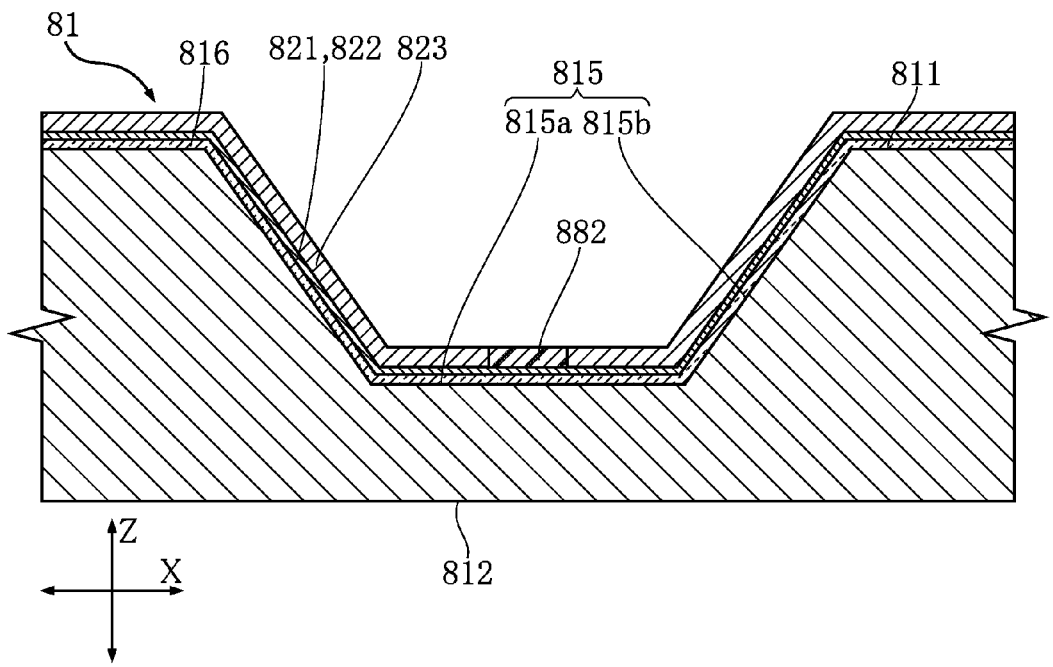
FIG. 16 is a cross-sectional view showing a process in the manufacturing method of the semiconductor device.

Proceeding to FIG. 16, the plated layer 823 is formed over the substrate 81 including the grooves 815. The plated layer 823 is formed in the region where the resist layer 882 is exposed, in other words the exposure region 882a. The plated layer 823 is formed by electrolytic plating. In this embodiment, the plated layer 823 is made of Cu, in a thickness of 2 to 10 μm.

Figure 17:
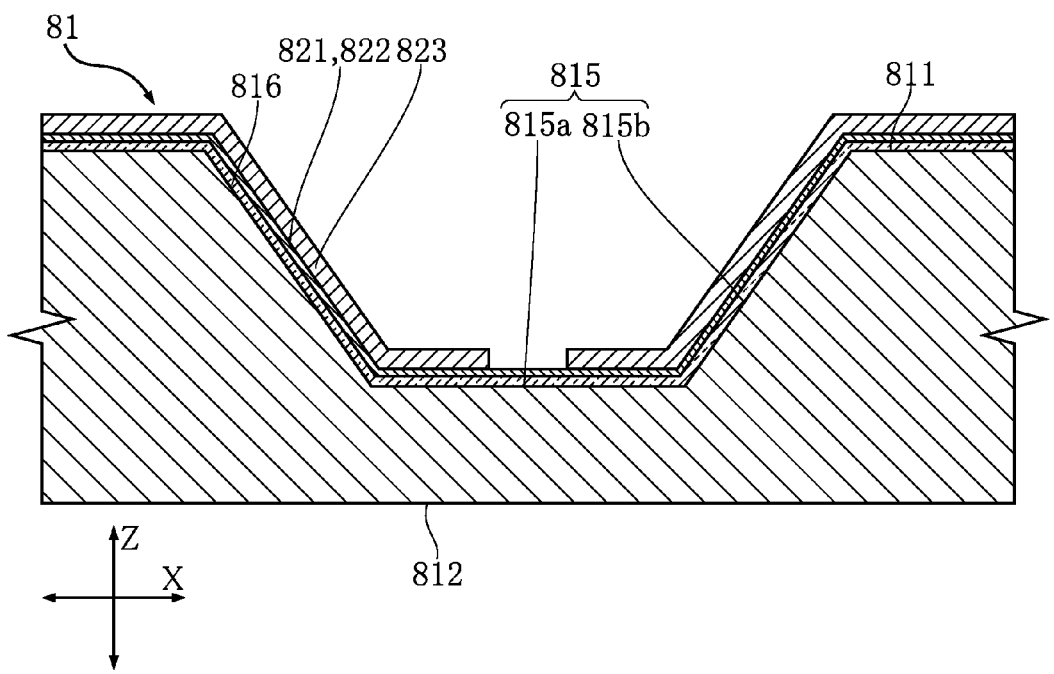
FIG. 17 is a cross-sectional view showing a process in the manufacturing method of the semiconductor device.

Then the resist layer 882 remaining on the substrate 81 including the grooves 815 is thoroughly removed, as shown in FIG. 17.

Figure 18:
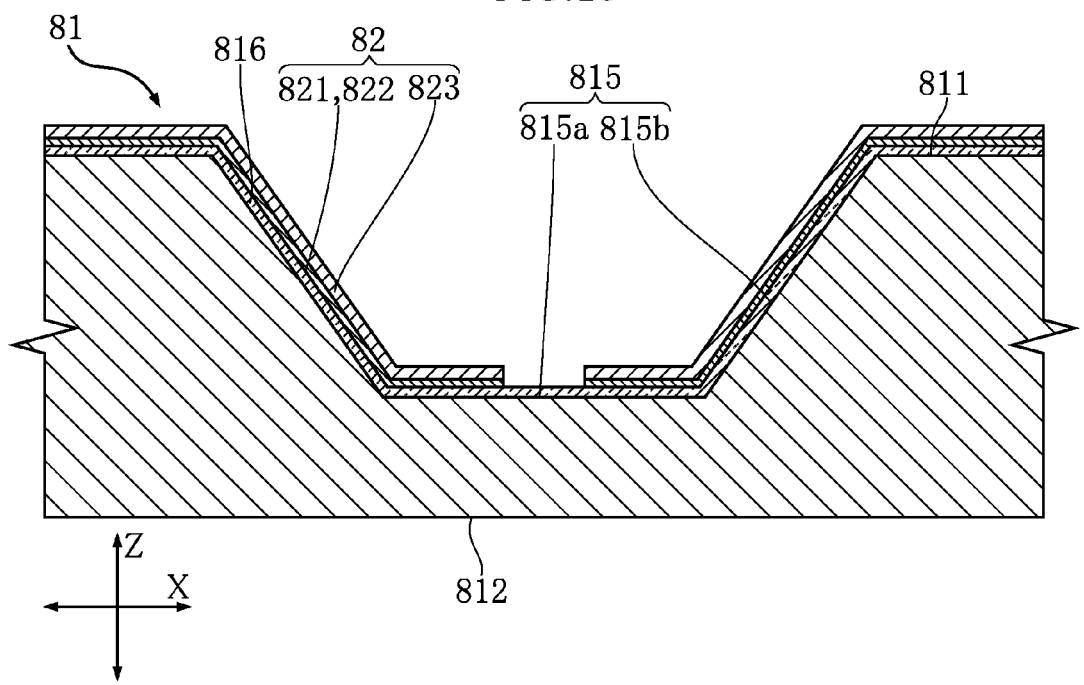
FIG. 18 is a cross-sectional view showing a process in the manufacturing method of the semiconductor device.

Proceeding to FIG. 18, the portion of the seed layer 822 not covered with the plated layer 823 is thoroughly removed by etching. The seed layer 822 may be removed, for example, by wet etching. By this etching, the barrier layer 821 covered with the seed layer 822 is also removed, together with the seed layer 822. The insulation layer 816 is exposed from the location where the barrier layer 821 and the seed layer 822 have been removed. At this point, the plated layer 823 is also removed by etching by an amount corresponding to the layer thickness of the barrier layer 821 and the seed layer 822. Through the above process, the conductive layer 82 is formed on the substrate 81 including the grooves 815.

Figure 19:
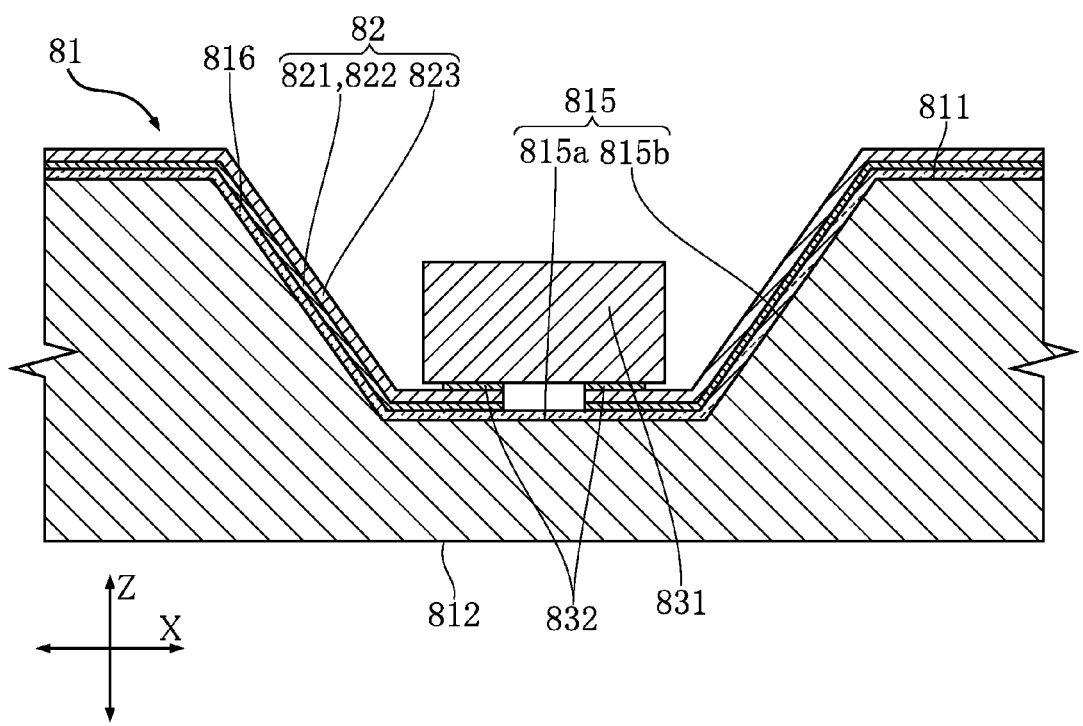
FIG. 19 is a cross-sectional view showing a process in the manufacturing method of the semiconductor device.

Proceeding to FIG. 19, a plurality of semiconductor elements 831 are mounted on the conductive layer 82 formed on the bottom surface 815a. The semiconductor elements 831 each correspond to the semiconductor element 31 of the semiconductor device A10. In this embodiment, the semiconductor elements 831 are all Hall-effect elements. To mount the semiconductor elements 831, first a non-illustrated flux is applied to the solder bumps, not illustrated either, formed so as to cover the element terminals formed on the lower surface of the semiconductor element 831 shown in FIG. 23. Then FCB is performed in collaboration with reflow soldering, so as to bond the semiconductor element 831 to the conductive layer 82 formed on the bottom surface 815a. The semiconductor elements 831 are mounted with a spacing between each other in the second direction Y, so as to be accommodated in the groove 815. In this process, the solder bumps are molten and solidified, thus turning into a bonding layer 832 which is electrically conductive. The bonding layer 832 corresponds to the bonding layer 32 of the semiconductor device A10.

Proceeding to FIG. 20, a sealing resin 84 is formed on the substrate 81 including the grooves 815. The sealing resin 84 corresponds to the sealing resin 4 of the semiconductor device A10. The grooves 815 are filled with the sealing resin 84. The sealing resin 84 is formed so as to cover a part of the insulation layer 816, the conductive layer 82 formed on the bottom surface 815a and the pair of sloped surfaces 815b, and the semiconductor elements 831. In this embodiment, the sealing resin 84 is made of, for example, an electrically insulative black epoxy resin. The sealing resin 84 is formed so as to expose the main surface 811 and the portion of the conductive layer 82 located on the main surface 811.

Proceeding to FIG. 21, a bump layer 824 is formed on the portion of the conductive layer 82 located on the main surface 811. The bump layer 824 may be formed, for example, through sequentially depositing Ni, Pd, and Au on each other by non-electrolytic plating. The bump layer 824 is formed so as to bulge in the same direction in which the main surface 811 faces, in the thickness direction Z of the substrate 81.

Referring now to FIG. 22, the substrate 81 is cut (diced) along cutting lines CL drawn in the first direction X and the second direction Y, so as to divide the substrate 81 into individual pieces of the semiconductor element 831. To cut the substrate 81, for example a plasma dicing method may be employed. The individual pieces each correspond to the semiconductor device A10. Throughout the foregoing process, the semiconductor device A10 can be obtained.

Advantages of the semiconductor device A10 will be described below.

Referring to FIG. 2, according to the above-described embodiment, the regions of one sloped surface 152 (e.g. the left-side surface in the figure) where the intermediate conduction path 21 is formed are not line-symmetrical to the regions of the other sloped surface 152 (e.g., the right-side surface in the figure) where the intermediate conduction path is formed. In other words, no intermediate conduction path is formed in the region of one sloped surface 152 that is line-symmetrical (with respect to the imaginary line N) to any one of the regions of the other sloped surface 152 where the intermediate conduction path 21 is formed. Because of such a configuration, in the manufacturing process of the semiconductor device A10 (patterning to form the conductive layer 82), even when the seed layers 822 formed on the pair of sloped surfaces 815b reflect light, the reflected light from one sloped surface 815b and the reflected light from the other sloped surface 815b will form mutually spaced-apart secondary exposure regions on the bottom surface 815a (i.e., the secondary exposure regions do not overlap with each other in plan view). Accordingly, formation of an unintended conductive layer 82 originating from the overlapping portion can be prevented. Therefore, the risk of malfunction of the semiconductor device A10 is minimized and the reliability of the semiconductor device A10 is improved.

Figure 23:
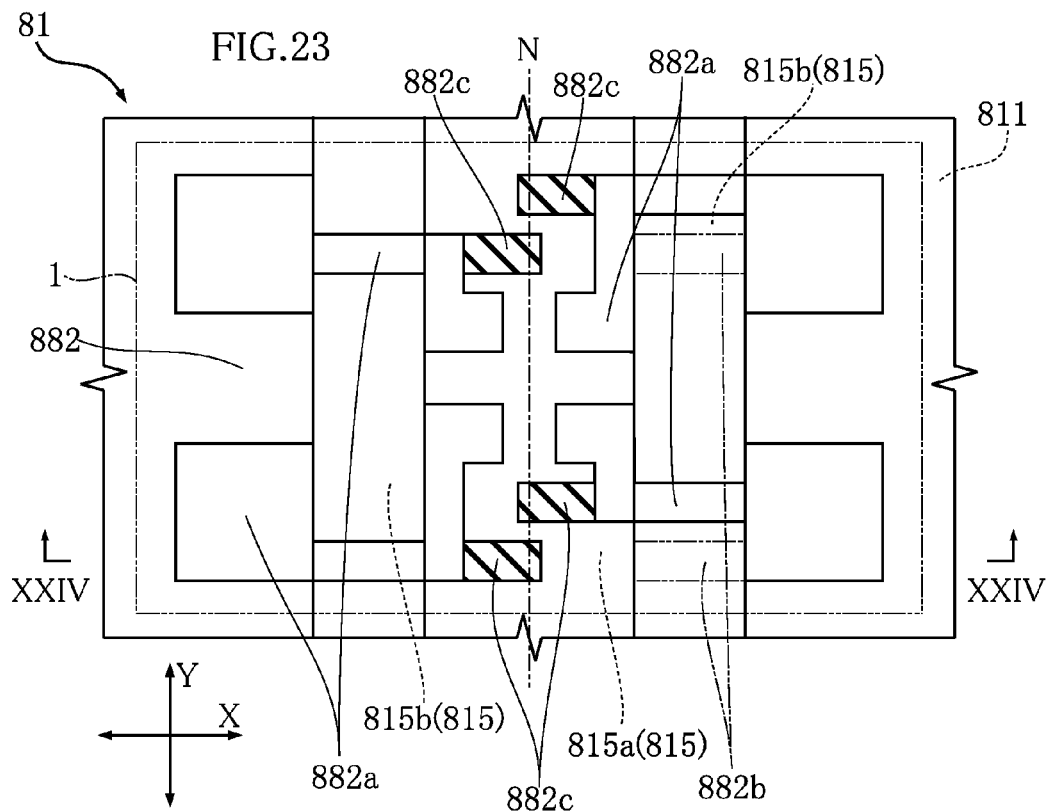
FIG. 23 is a plan view showing a substrate corresponding to that of FIG. 15, on which secondary exposure regions are formed.
Figure 24:
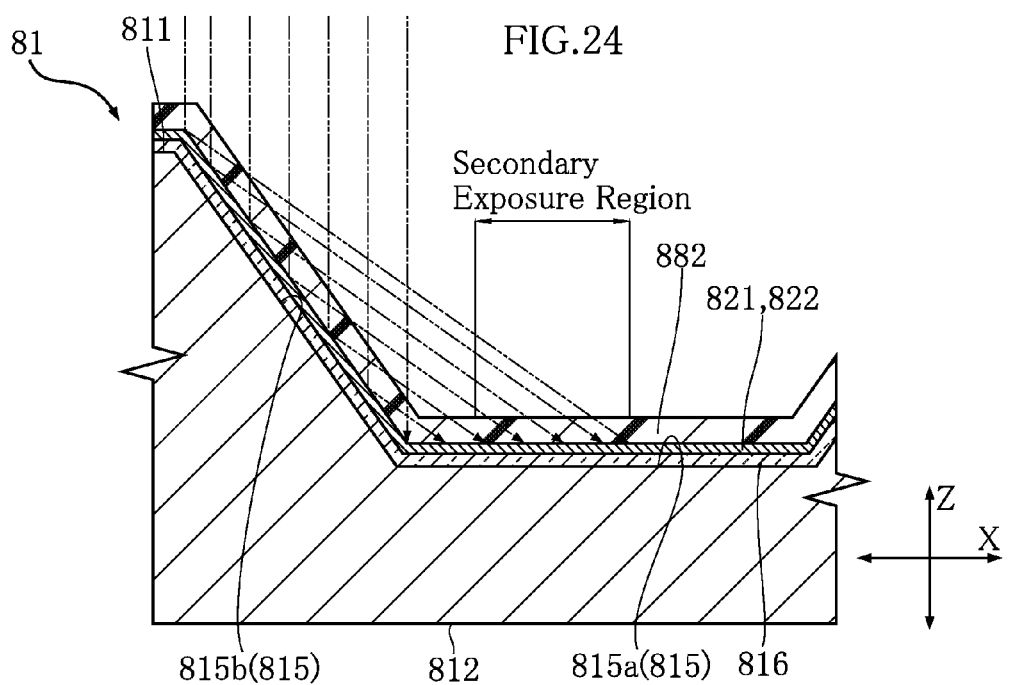
FIG. 24 is an enlarged cross-sectional view taken along a line XXIV-XXIV in FIG. 23.

FIG. 23 is a plan view showing the substrate 81 corresponding to FIG. 15, on which it is assumed that secondary exposure regions are formed. In FIG. 23, sections surrounded by imaginary lines (double-dot chain lines) represent the region corresponding to the substrate 1 of the semiconductor device A10. In FIG. 23, in addition, hatched portions represent the secondary exposure regions 882c that are assumed to have been formed. FIG. 24 is an enlarged fragmentary cross-sectional view taken along a line XXIV-XXIV in FIG. 23. In FIG. 24, the paths of the light incident upon the substrate 81 in the exposure process of the photolithography are indicated by imaginary lines (double-dot chain lines).

When the light for the exposure is transmitted through the resist layer 882 formed on the pair of sloped surfaces 815*b* and reflected by the seed layer 822 formed under the resist layer 882, the secondary exposure regions 882*c* are formed by the reflected light on the bottom surface 815*a*, as shown in FIG. 23 and FIG. 24. However, since the secondary exposure regions 882*c* do not overlap with each other in plan view at any location, there is no likelihood that an unintended conductive layer 82 is formed. Here, depending on the sensitivity of the resist employed for the manufacturing of the semiconductor device A10, an unintended conductive layer 82 might be formed over the entire region where the secondary exposure regions 882*c* are formed. Even in such a case, the pads 23 are each located at a position deviated from the intermediate conduction path 21 in the second direction Y, so as not to overlap with any of the intermediate conduction paths 21 as shown in FIG. 2, and therefore the semiconductor device A10 can be exempted from suffering a malfunction, even though an unintended conductive layer 82 is formed.

Referring to FIG. 23, in the manufacturing process of the semiconductor device A10, the exposure regions 882*a* (where the intermediate conduction paths 21 of the semiconductor device A10 are formed) are formed parallel to the first direction X, on the pair of sloped surfaces 815*b*. Such a configuration minimizes the size of the secondary exposure region 882*c* formed on the bottom surface 815*a* in the second direction Y, thereby further assuring that the semiconductor device A10 is exempted from suffering a malfunction, even though an unintended conductive layer 82 is formed.

Referring again to FIG. 23, in the manufacturing process of the semiconductor device A10, the exposure regions 882*a* (where the bottom conduction paths 22 of the semiconductor device A10 are formed), each including a portion extending parallel to the second direction Y, the portion being located in contact with the intersection between the bottom surface 815*a* and the sloped surface 815*b*, are formed on the bottom surface 815*a*. Such a configuration allows a larger margin to be secured in plan view, between the exposure region 882*a* and the secondary exposure region 882*c* formed on the bottom surface 815*a*, thereby further assuring that the semiconductor device A10 is exempted from suffering a malfunction, even though an unintended conductive layer 82 is formed owing to the secondary exposure region 882*c*.

Second Embodiment

Referring to FIG. 25 to FIG. 28, a semiconductor device A20 according to a second embodiment will be described below. In these drawings, elements same as or similar to those of the semiconductor device A10 described above are indicated by the same numeral and description thereof may not be given.

Figure 25:
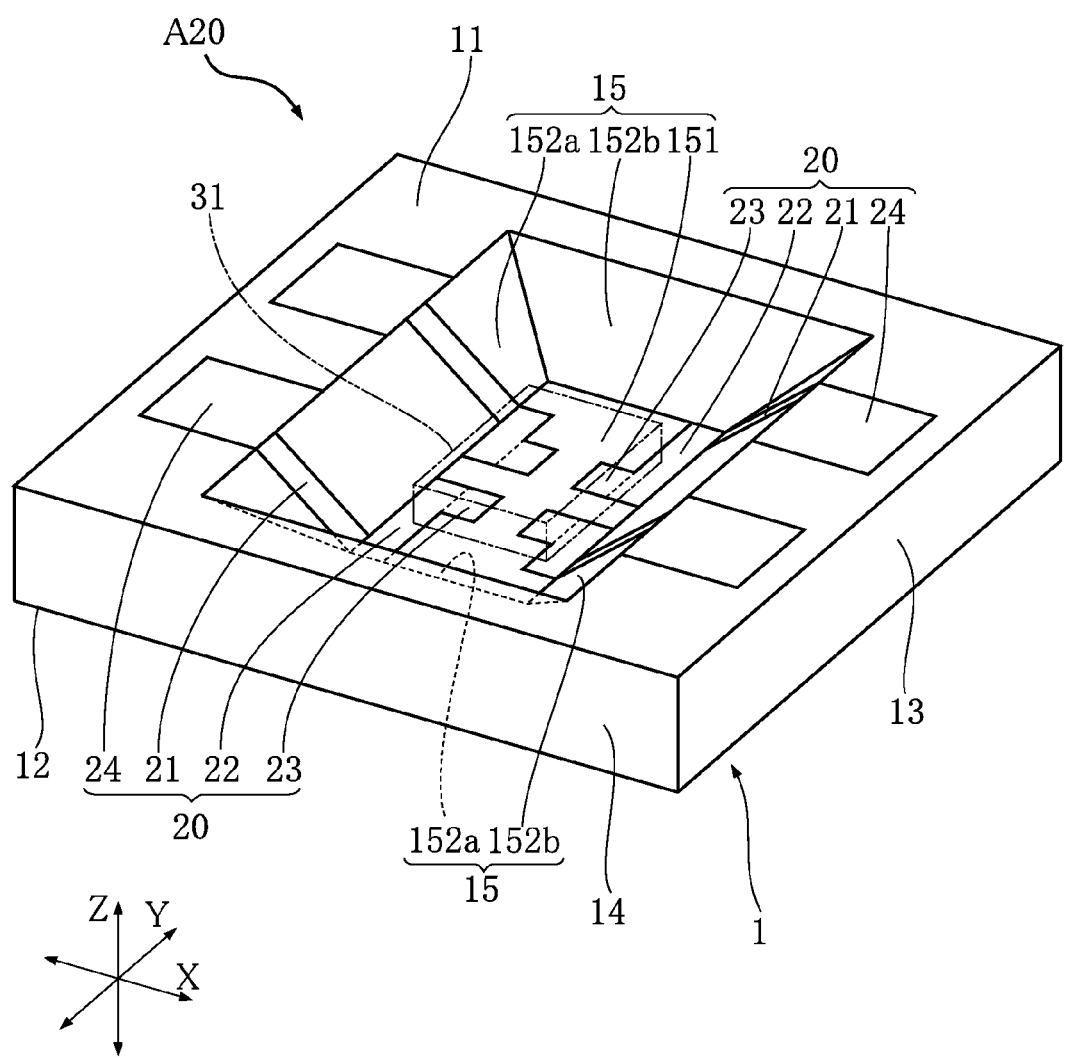
FIG. 25 is a perspective view illustrating a semiconductor device according to a second embodiment.
Figure 26:
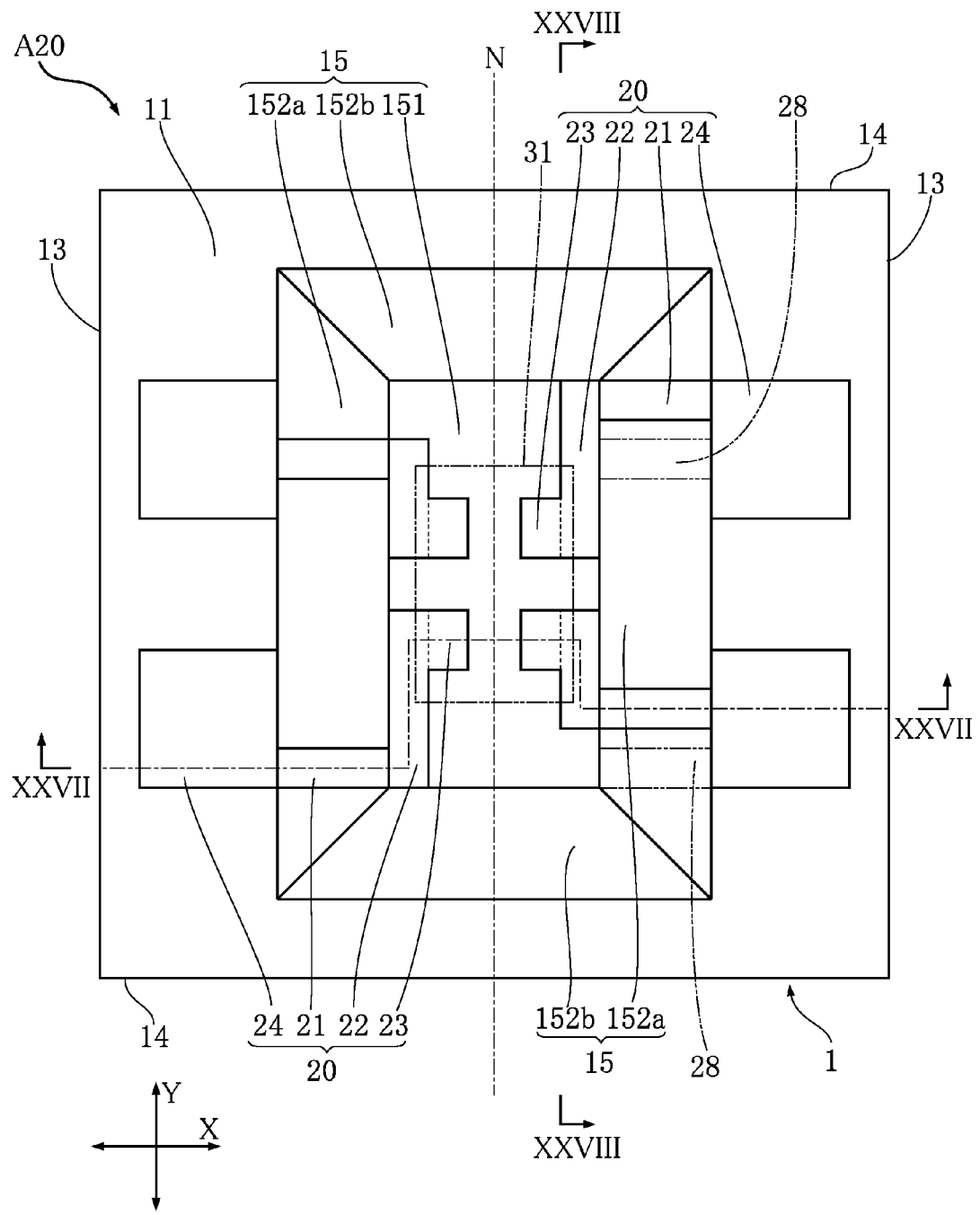
FIG. 26 is a plan view showing the semiconductor device of FIG. 25.
Figure 27:
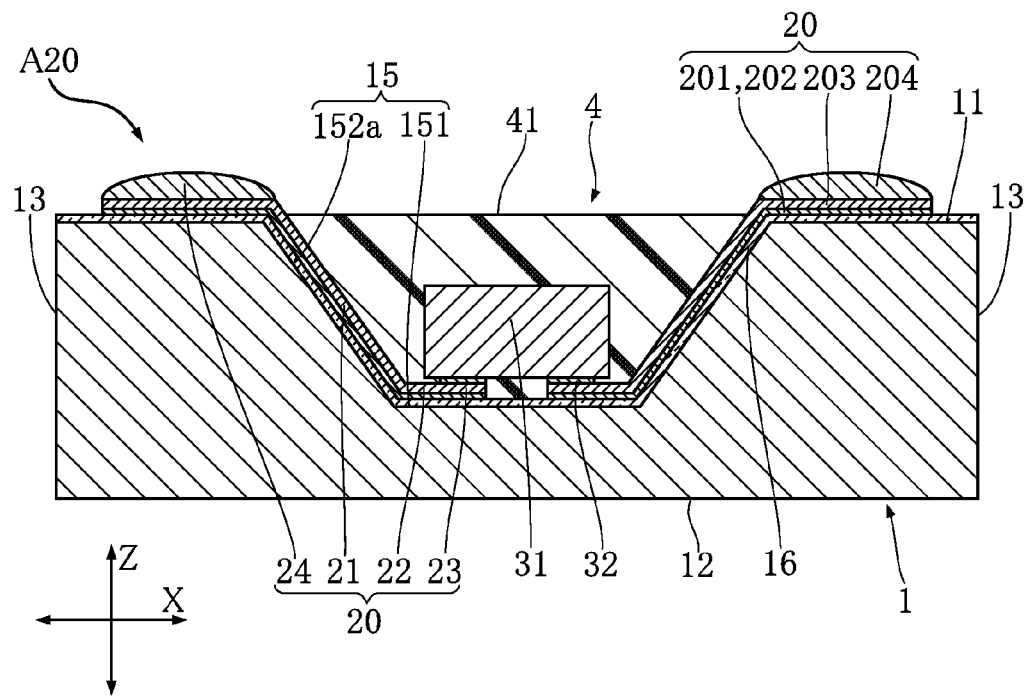
FIG. 27 is a cross-sectional view taken along a line XXVII-XXVII in FIG. 26.
Figure 28:
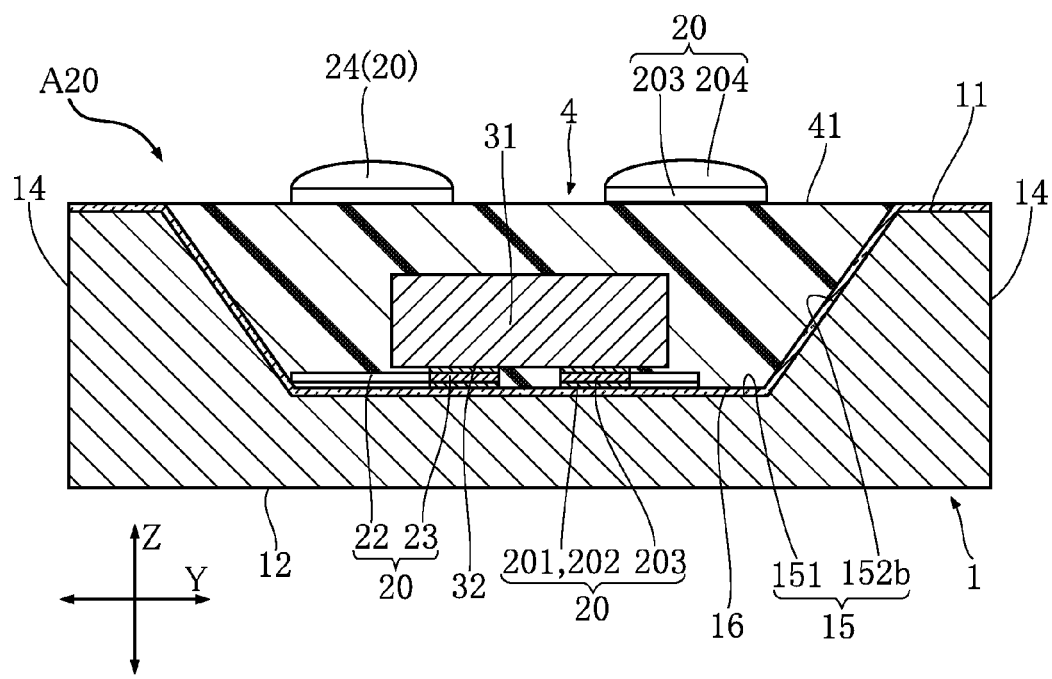
FIG. 28 is a cross-sectional view taken along a line XXVIII-XXVIII in FIG. 26.

FIG. 25 is a perspective view showing a part of the semiconductor device A20. FIG. 26 is a plan view illustrating the semiconductor device A20. FIG. 27 is a cross-sectional view taken along a line XXVII-XXVII (chain line) in FIG. 26. FIG. 28 is a cross-sectional view taken along a line XXVIII-XXVIII in FIG. 26.

The semiconductor device A20 of the second embodiment is different from the semiconductor device A10 in configuration of the substrate 1 and the sealing resin 4. As shown in FIG. 25 and FIG. 26, the second side faces 14 have no lateral openings. In this embodiment, the recess 15 includes a bottom surface 151, a pair of first sloped surfaces 152*a*, and a pair of second sloped surfaces 152*b*.

As shown in FIG. 25 and FIG. 26, the recess 15 is formed so as to recede from the main surface 11. The recess 15 is not formed all the way through the substrate 1 in the thickness direction Z. In this embodiment, the recess 15 has a rectangular shape in plan view. The recess 15 is formed by anisotropic etching applied to the main surface 11, as with the semiconductor device A10. In the second embodiment also, the main surface 11 is a (100) surface.

As shown in FIG. 25 and FIG. 26, the pair of first sloped surfaces 152*a* are spaced apart from each other in the first direction X. The lower ends of the first sloped surfaces 152*a* are respectively connected to the ends of the bottom surface 151 in the first direction X. The upper ends of the first sloped surfaces 152*a* are each connected to the main surface 11. In this embodiment the main surface 11 is the (100) surface, and hence the first sloped surfaces 152*a* are (111) surfaces. Therefore, the inclination angle of the first sloped surfaces 152*a* with respect to the bottom surface 151 is equal, which is 54.74°. Here, the intermediate conduction paths 21 are formed on each of the pair of first sloped surfaces 152*a*.

As shown in FIG. 25 and FIG. 26, the pair of second sloped surfaces 152*b* are spaced apart from each other in the second direction Y. The lower ends of the second sloped surfaces 152*b* are respectively connected to the ends of the bottom surface 151 in the second direction X. The upper ends of the second sloped surfaces 152*b* are each connected to the main surface 11. In this embodiment the main surface 11 is the (100) surface, and hence the second sloped surfaces 152*b* are (111) surfaces. Therefore, the inclination angle of the second sloped surfaces 152*b* with respect to the bottom surface 151 is equal, which is 54.74°. No conductive layer 20 is formed on the second sloped surfaces 152*b*.

As shown in FIG. 25 and FIG. 26, the pair of first sloped surfaces 152*a* and the pair of second sloped surfaces 152*b* are connected to each other in the thickness direction Z of the substrate 1. Accordingly, the recess 15 has a truncated pyramid shape in which the upper base is larger than the lower base (bottom surface 151). With such a configuration, the main surface 11 has a frame shape surrounding the recess 15 in plan view.

As shown in FIG. 25 to FIG. 28, the sealing resin 4 is filled in the recess 15, so as to cover the bottom surface 151, the pair of first sloped surfaces 152*a*, the pair of second sloped surfaces 152*b*, the intermediate conduction paths 21, the bottom conduction paths 22, the pads 23, and the semiconductor element 31. The main surface 11 and the terminals 24 are not covered with the sealing resin 4 but exposed. In this embodiment, the sealing resin 4 has a resin main surface 41. The resin main surface 41 faces in the same direction as the main surface 11. The resin main surface 41 is flat and exposed to the outside of the semiconductor device A20.

The configuration of the second embodiment also minimizes the risk of malfunctioning of the semiconductor device A20 that would otherwise originate from the formation of an unintended conductive layer in the manufacturing process of the semiconductor device A20.

The present invention is not limited to the embodiments described above. The details of the present invention may be modified in various manners.

The invention claimed is:

1. A semiconductor device comprising:
    a semiconductor element;
    a semiconductor substrate on which the semiconductor element is mounted, the substrate having a main surface;
    a conductive layer formed on the substrate; and a sealing resin covering the semiconductor element,
wherein the substrate is formed with a recess receding from the main surface, the recess including a bottom surface and first and second sloped surfaces spaced apart from each other in a first direction perpendicular to a thickness direction of the substrate,
the conductive layer includes first conduction paths on the first sloped surface, second conduction paths on the second sloped surface and bottom conduction paths on the bottom surface,
the second sloped surface includes a plurality of regions that are line-symmetrical to the first conduction paths with respect to an imaginary line parallel to a second direction perpendicular to both the thickness direction of the substrate and the first direction, and the plurality of regions are without the second conduction paths,
each of the bottom conduction paths includes a portion extending parallel to the second direction,
said portion extending parallel to the second direction is in physical contact with an intersection between the bottom surface and the first or second sloped surface, and
the semiconductor element is a Hall-effect element.

2. The semiconductor device according to claim 1, wherein each of the first and the second conduction paths is parallel to the first direction.

3. The semiconductor device according to claim 1, wherein the conductive layer further includes pads formed on the bottom surface and electrically connected to the bottom conduction paths, and the semiconductor element is mounted on the pads.

4. The semiconductor device according to claim 1, wherein the conductive layer further includes terminals formed on the main surface and electrically connected to the first or second conduction path.

5. The semiconductor device according to claim 1, wherein the conductive layer includes a seed layer and a plated layer stacked on each other, and the seed layer is interposed between the substrate and the plated layer.

6. The semiconductor device according to claim 5, wherein the plated layer is thicker than the seed layer.

7. The semiconductor device according to claim 6, wherein the seed layer and the plated layer are both made of Cu.

8. The semiconductor device according to claim 1, wherein the first and the second sloped surfaces are inclined at a same angle with respect to the bottom surface.

9. The semiconductor device according to claim 1, wherein the bottom surface is orthogonal to the thickness direction of the substrate.

10. The semiconductor device according to claim 1, wherein the substrate includes a pair of first side faces spaced apart from each other in the first direction and a pair of second side faces spaced apart from each other in the second direction, the first side faces and the second side faces being orthogonal to the main surface.

11. The semiconductor device according to claim 10, wherein the recess is open to outside at the second side faces.

12. The semiconductor device according to claim 11, wherein the recess has a uniform cross section in the second direction.

13. The semiconductor device according to claim 1, wherein the substrate is made of a monocrystalline semiconductor material.

14. The semiconductor device according to claim 13, wherein the semiconductor material is Si.

15. The semiconductor device according to claim 14, wherein the main surface is a (100) surface.

16. The semiconductor device according to claim 1, further comprising an insulation layer formed over the main surface, the bottom surface and the sloped surfaces, wherein the conductive layer is in contact with the insulation layer.

17. The semiconductor device according to claim 16, wherein the insulation layer is made of SiO2.

18. The semiconductor device according to claim 16, wherein the conductive layer further includes a barrier layer held in contact with the insulation layer.

19. The semiconductor device according to claim 18, wherein the barrier layer is made of Ti.

20. A method of manufacturing a semiconductor device, the method comprising:
forming at least one groove in a semiconductor substrate having a main surface in a manner such that the groove recedes from the main surface and has a bottom surface and first and second sloped surfaces spaced apart from each other in a first direction perpendicular to a thickness direction of the substrate, and that the groove extends in a second direction perpendicular to both the thickness direction of the substrate and the first direction;
forming a conductive layer on the substrate including the groove;
mounting semiconductor elements on the bottom surface and with intervals between the semiconductor elements, the semiconductor elements being accommodated in the groove;
forming a sealing resin for covering the semiconductor elements; and
cutting the substrate along the first direction and the second direction thereby dividing the substrate into individual pieces each including one of the semiconductor elements,
wherein the forming of the conductive layer includes patterning by photolithography for forming the conductive layer on the substrate with the groove in a manner such that the photolithography forms first exposure regions at the first sloped surface and second exposure regions at the second sloped surface, and that none of the second exposure regions is line-symmetrical to any one of the first exposure regions with respect to an imaginary line parallel to the second direction,
the patterning includes forming at least one bottom exposure region on the bottom surface, the bottom exposure region including an extension extending parallel to the second direction, and the bottom exposure region being connected to one of the first and the second exposure regions, and
the extension of the bottom exposure region is in contact with an intersection between the bottom surface and one of the sloped surfaces.

21. The method according to claim 20, wherein the first exposure regions and the second exposure regions extend parallel to the first direction.

22. The method according to claim 20, wherein the forming of the conductive layer includes forming a seed layer on the substrate with the groove before the patterning.

23. The method according to claim 22, wherein the seed layer is formed by sputtering.

24. The method according to claim 22, wherein the patterning includes removing a light-exposed portion of a resist layer on the substrate with a developing solution.

25. The method according to claim 24, wherein the forming of the conductive layer includes forming a plated layer on an exposed portion of the seed layer after the patterning.

26. The method according to claim 25, wherein the plated layer is formed by electrolytic plating.

27. The method according to claim 25, wherein the forming of the conductive layer includes removing a portion of the seed layer not covered with the plated layer after the forming of the plated layer.

28. The method according to claim 27, wherein the removing of the seed layer includes an etching process performed after the removing of the resist layer formed on the substrate with the grooves.

29. The method according to claim 22, further comprising forming an insulation layer on the substrate with the groove before the forming of the conductive layer.

30. The method according to claim 29, wherein the insulation layer is formed by thermal oxidation.

31. The method according to claim 29, wherein the forming of the conductive layer includes forming a barrier layer in contact with the insulation layer before the forming of the seed layer.

32. The method according to claim 31, wherein the barrier layer is formed by sputtering.

33. The method according to claim 20, wherein the substrate is made of a monocrystalline semiconductor material.

34. The method according to claim 33, wherein the semiconductor material is Si.

35. The method according to claim 34, wherein the main surface is a (100) surface.

36. The method according to claim 35, wherein the groove is formed by anisotropic etching with respect to the substrate.

37. The method according to claim 20, wherein the semiconductor elements are Hall-effect elements.

\* \* \* \* \*